(12) United States Patent
Lee

(10) Patent No.: US 9,911,750 B2
(45) Date of Patent: Mar. 6, 2018

(54) SEMICONDUCTOR MEMORY DEVICES INCLUDING ASYMMETRIC WORD LINE PADS

(71) Applicant: Jaegoo Lee, Suwon-si (KR)

(72) Inventor: Jaegoo Lee, Suwon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 14/996,821

(22) Filed: Jan. 15, 2016

(65) Prior Publication Data

US 2016/0133644 A1   May 12, 2016

Related U.S. Application Data

(63) Continuation of application No. 13/168,151, filed on Jun. 24, 2011, now abandoned.

(30) Foreign Application Priority Data

Jun. 24, 2010   (KR) ........................ 10-2010-0060184

(51) Int. Cl.
| | |
|---|---|
| *H01L 23/48* | (2006.01) |
| *H01L 27/088* | (2006.01) |
| *H01L 23/528* | (2006.01) |
| *H01L 27/115* | (2017.01) |
| *H01L 27/11582* | (2017.01) |
| *H01L 27/11551* | (2017.01) |
| *H01L 27/11556* | (2017.01) |
| *H01L 27/11578* | (2017.01) |

(Continued)

(52) U.S. Cl.
CPC ...... *H01L 27/11582* (2013.01); *H01L 23/528* (2013.01); *H01L 27/11548* (2013.01); *H01L 27/11551* (2013.01); *H01L 27/11556* (2013.01); *H01L 27/11575* (2013.01); *H01L 27/11578* (2013.01); *H01L 2924/0002* (2013.01)

(58) Field of Classification Search
CPC ............. H01L 29/7813; H01L 29/7802; H01L 29/7827; H01L 29/0696; H01L 29/66666
See application file for complete search history.

(56) References Cited

U.S. PATENT DOCUMENTS

| | | | |
|---|---|---|---|
| 6,433,421 B2 | 8/2002 | Masuda et al. | |
| 2010/0052042 A1* | 3/2010 | Tanaka ................ | H01L 21/8221 257/324 |

(Continued)

FOREIGN PATENT DOCUMENTS

| | | |
|---|---|---|
| JP | 2009-088446 A | 4/2009 |
| JP | 2009146954 A | 7/2009 |
| KR | 2009-0043463 A | 5/2009 |

*Primary Examiner* — Ori Nadav
*Assistant Examiner* — Ernest Allen, III
(74) *Attorney, Agent, or Firm* — Harness, Dickey & Pierce, P.L.C.

(57) ABSTRACT

Semiconductor memory devices may include a semiconductor substrate, a first stack disposed on the semiconductor substrate and a second stack disposed on the first stack. The first stack may include a plurality of first word lines with a plurality of first line pads stacked in a stair form, and the second stack may include a plurality of second word lines with a plurality of second line pads stacked in a stair form. The second stack may be shifted on the first stack such that sides of the plurality of first word line pads are exposed.

4 Claims, 32 Drawing Sheets

(51) Int. Cl.
*H01L 27/11548* (2017.01)
*H01L 27/11575* (2017.01)

(56) References Cited

U.S. PATENT DOCUMENTS

| | | |
|---|---|---|
| 2010/0117143 A1 | 5/2010 | Lee et al. |
| 2010/0144133 A1* | 6/2010 | Nomura ............ H01L 27/11578 |
| | | 438/586 |
| 2010/0155810 A1 | 6/2010 | Kim et al. |
| 2011/0180941 A1* | 7/2011 | Hwang ............. H01L 27/11575 |
| | | 257/786 |
| 2011/0204420 A1* | 8/2011 | Kim ................... H01L 27/0688 |
| | | 257/211 |
| 2011/0309426 A1 | 12/2011 | Purayath et al. |
| 2012/0306089 A1* | 12/2012 | Freeman ........... H01L 27/11548 |
| | | 257/773 |

\* cited by examiner

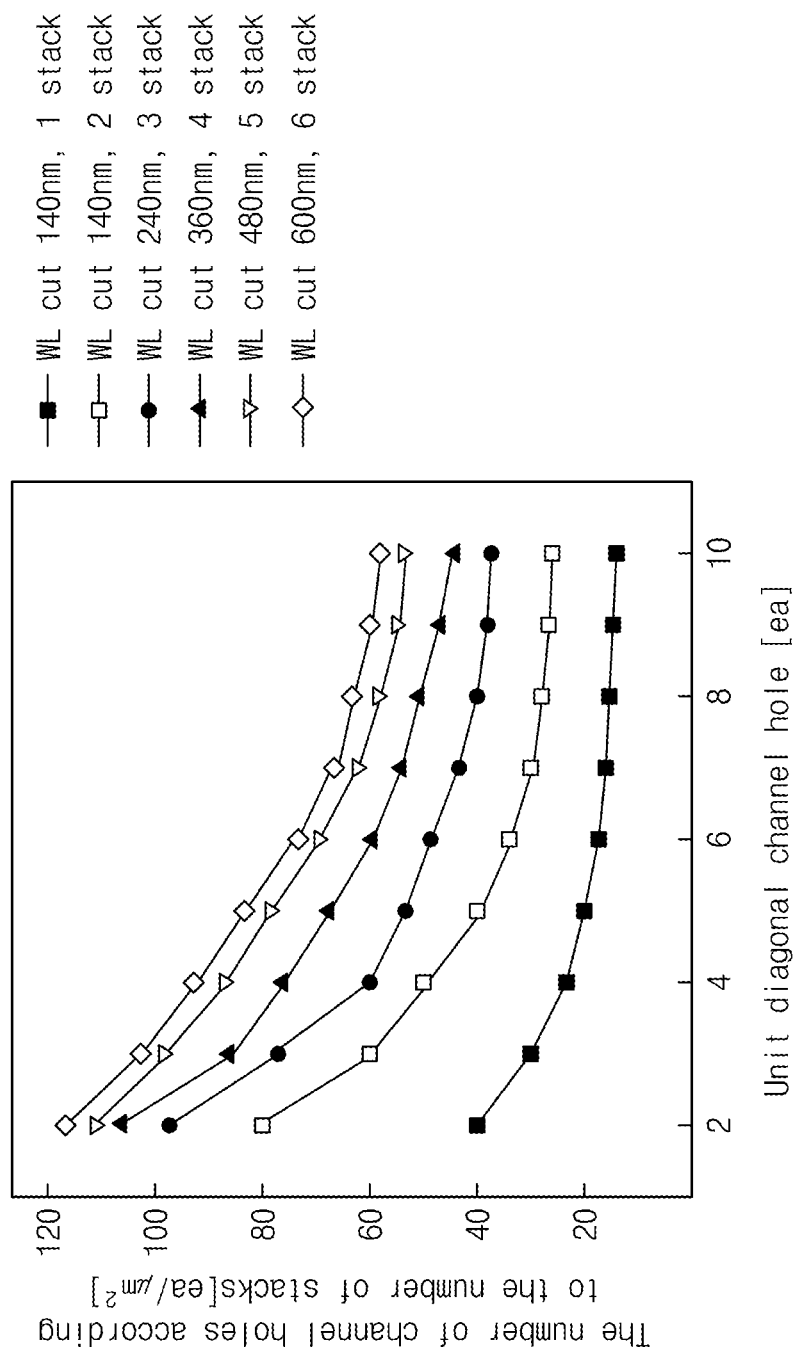

SEMICONDUCTOR MEMORY DEVICES INCLUDING ASYMMETRIC WORD LINE PADS

CROSS-REFERENCE TO RELATED APPLICATION

This U.S. non-provisional patent application is a continuation of U.S. patent application Ser. No. 13/168,151, filed on Jun. 24, 2011, which claims priority under 35 U.S.C. § 119 to Korean Patent Application No. 10-2010-0060184, filed on Jun. 24, 2010, in the Korean Intellectual property Office (KIPO), the entire contents of each of the above-references applications are incorporated by reference.

BACKGROUND

1. Field

Example embodiments of the inventive concepts relate to semiconductors, and more particularly, to semiconductor memory devices.

2. Description of the Related Art

Integration density of semiconductor memory devices may be an important factor for determining the price of a product. In the case of typical two-dimensional or planar semiconductor memory devices, integration density is mainly determined by the area occupied by a unit memory cell, thereby being largely affected by the advancement of fine pattern formation technology. Although the integration density of two-dimensional semiconductor memory devices is increasing, ultra-expensive equipment needed to form a fine patterns is restrictive. Therefore, vertical transistor technology has been suggested for realizing high integration density semiconductor memory devices.

SUMMARY

Example embodiments of the inventive concepts may provide semiconductor memory devices with improved integration density without increasing a chip area. Semiconductor memory device according to example embodiments may include asymmetric word line pads.

Example embodiments of the inventive concepts provide a semiconductor memory device including a semiconductor substrate, a first stack provided on the semiconductor substrate, and in which a plurality of first word lines comprising a plurality of first word line pads stacked in a stair form, and a second stack disposed on the first stack, and in which a plurality of second word lines including a plurality of first word line pads stacked in a stair form. The second stack may be shift on the first stack such that sides of the plurality of first word line pads may be exposed.

According to some example embodiments of the inventive concepts, the semiconductor memory device may further include a plurality of first pad contacts which contact the exposed first word line pads to connect the plurality of first word lines to a driving circuit and a plurality of second pad contacts which contact the second word line pads to connect the plurality of second word lines to the driving circuit. According to other example embodiments of the inventive concepts, the plurality of first word line pads may constitute a stair form at least on both left and right sides of the first stack, and the plurality of second word line pads may constitute a stair form at least on both left and right sides of the second stack.

According to still other example embodiments of the inventive concepts, the plurality of first pad contacts are in contact with the plurality of first word line pads at the left side of the first stack, and the plurality of second pad contacts may be in contact with the plurality of second word line pads at the left side of the second stack. According to even other example embodiments of the inventive concepts, the plurality of first pad contacts and the plurality of second pad contacts may be alternately arranged not to overlap each other. In yet other example embodiments of the inventive concepts, the plurality of first pad contacts are in contact with the plurality of first word line pads at the left side of the first stack, and the plurality of second pad contacts may be in contact with the plurality of second word line pads at the right side of the second stack.

According to further example embodiments of the inventive concepts, the semiconductor memory device may further include at least one third stack between the first and second stacks, the at least one third stack comprising a plurality of third word lines including a plurality of third word line pads stacked in a stair form. According to still further example embodiments of the inventive concepts, the third stack may be shifted on the first stack such that the sides of the plurality of first word lines pads are exposed, and the second stack may be shifted on the third stack such that the sides of the plurality of third word lines pads are exposed. In even further example embodiments of the inventive concepts, the semiconductor memory device may further include a plurality of third pad contacts which are in contact with the exposed plurality of third word line pads to connect the plurality of third word lines to the driving circuit.

According to yet further example embodiments of the inventive concepts, the plurality of third line pads may constitute a stair form at least on both left and right sides of the third stack. According to other example embodiments of the inventive concepts, the first stack and the second stack have the same size, or the first stack may have a greater size than the second stack. In still other embodiments of the inventive concepts, the semiconductor memory device may further include a plurality of vertical channels vertically penetrating the first and the second stacks and a plurality of bit lines electrically connected to the plurality of vertical channels. The plurality of vertical channels may be arranged in a line form or may be arranged in a zigzag form In even other example embodiments of the inventive concepts, the first stack may further include at least one lower selection line disposed below the plurality of first word lines, the second stack further includes at least one upper selection line disposed above the plurality of second word lines; the lower selection line includes a lower selection line pad which forms a stair form together with the plurality of first word line pads, and the upper selection line may include an upper selection line pad which forms a stair form together with the plurality of second word line pads. In yet other example embodiments of the inventive concepts, the first stack may further include a first dummy word line between the plurality of first word lines and the at least one upper selection line and the second stack may further include a second dummy word line between the plurality of second word lines and the at least one upper selection line.

In further example embodiments of the inventive concepts, the semiconductor memory device may further include a fourth stack which is spaced apart from the first stack by a first distance in a horizontal direction and has the same structure as the first stack, and a fifth stack which is spaced apart from the second stack by the first distance in the horizontal direction and has the same structure as the second stack. The fifth stack may be shifted on the fourth stack such that a portion of the side of the fourth stack is exposed. In still further example embodiments of the inventive concepts, the fifth stack may not overlap with the first stack vertically.

In even further example embodiments of the inventive concepts, the semiconductor memory device may further include a plurality of first contact pads which are in contact with the first word line pads to connect the plurality of first word lines to a driving circuit and a plurality of second pad contacts which are in contact with the second word line pads to connect the plurality of second word lines to the driving circuit. The plurality of first pad contacts may be disposed between the second stack and the fifth stack.

In yet further example embodiments of the inventive concepts, the semiconductor memory device may further include a first stack in which a plurality of first word line pads are stacked in a stair form and a second stack which is stacked on the first stack, and in which a plurality of second word line pads are stacked in a stair form. The plurality of second word line pads may cover some of the plurality of first word line pads to expose the sides of the plurality of first word line pads. In some example embodiments of the inventive concepts, the semiconductor memory devices may further include a plurality of first pad contacts contacting the plurality of first word line pads and a plurality of second pad contacts contacting the plurality of second word line pads.

The plurality of first pad contacts may not overlap the plurality of second pad contacts. In other example embodiments of the inventive concepts, the semiconductor memory device may further include at least one third stack between the first and second stacks, the at least one third stack comprising a plurality of third word line pads stacked in a stair form. The plurality of third word line pads may cover some of the plurality of first word line pads to expose the sides of the plurality of first word line pads, and the plurality of second word line pads may cover some of the plurality of third word line pads to expose the sides of the plurality of third word line pads.

According to example embodiments, a semiconductor memory device includes a semiconductor substrate, a first stack on the semiconductor substrate, the first stack including a plurality of first word lines with a plurality of first word line pads, a structure of at least one side of the plurality of first word line pads being stair-type and a second stack on the first stack, the second stack including a plurality of second word lines with a plurality of second word line pads, a structure of at least one side of the plurality of second word line pads being stair-type, the second stack shifted on the first stack such that the plurality of first word line pads on at least one side of the first stack are exposed.

According to example embodiments, a semiconductor memory device includes a substrate layer a multilayer structure on the substrate layer, the multilayer structure including a first stack including at least three first layers on the substrate layer, sidewalls of the first layers offset from each other on at least one first side of the multilayer structure such that at least a portion of each of the first layers is exposed in the first stack and a second stack including at least three second layers on the first stack, sidewalls of the second layers offset from each other on at least one second side of the multi-layer structure such that at least a portion of each of the second layers is exposed in the second stack, a side of the first stack offset from a side of the second stack on at least one third side of the multilayer structure such that at least a portion of the first stack is exposed in the multilayer structure, the at least one third side orthogonal to the at least one first and second sides.

BRIEF DESCRIPTION OF THE DRAWINGS

Example embodiments of the inventive concepts will be more clearly understood from the following brief description taken in conjunction with the accompanying drawings. FIGS. 1-9B represent non-limiting, example embodiments as described herein.

FIG. 8B is a graph of a number of channel holes according to a number of stacks (ea/$\mu m^2$) according to example embodiments of the inventive concepts;

FIGS. 9A and 9B are block diagrams illustrating apparatuses including semiconductor memory devices according to example embodiments of the inventive concepts.

Figure 1A:
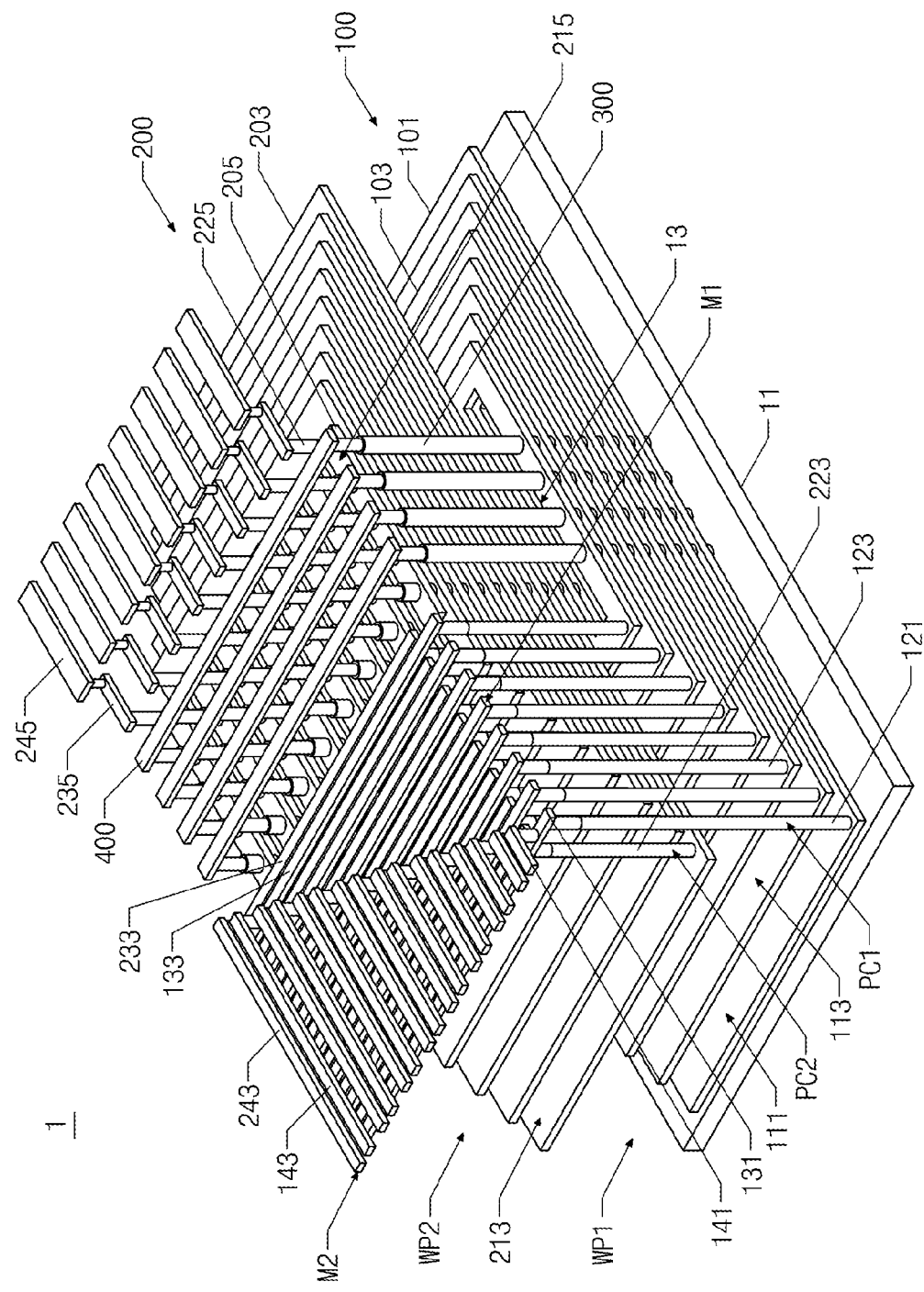
FIGS. 1A and 1B are perspective views illustrating semiconductor memory devices according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments of the inventive concepts. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments of the inventive concepts.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments of the inventive concepts. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments of the inventive concepts.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1B:
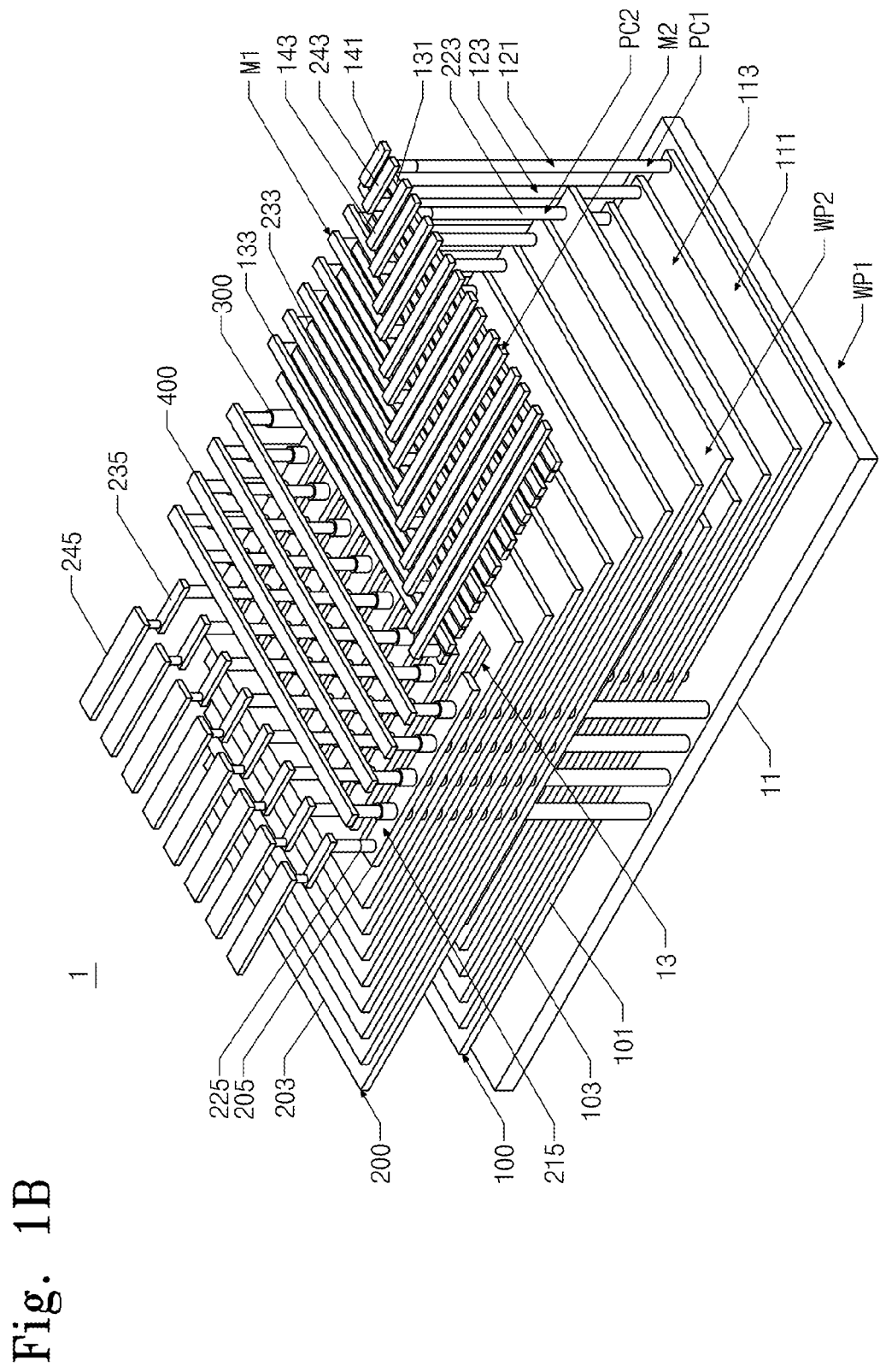

FIGS. 1A and 1B are perspective views illustrating semiconductor memory devices according to example embodiments of the inventive concepts. Referring to FIGS. 1A and 1B, a semiconductor memory device 1 according to example embodiments may include a semiconductor substrate 11, a first stack 100, a second stack 200, a plurality of vertical channels 300 and a plurality of bit lines 400. The first stack 100 may include a plurality of first word lines 103 on the semiconductor substrate 11. The second stack 200 may include a plurality of second word lines 203 stacked on the first stack 100. The plurality of vertical channels 300 may vertically penetrate through the first stack 100 and the second stack 200. The plurality of bit lines 400 may be electrically connected to the vertical channels 300. The first stack 100 may include a lower selection line 101 below the first word lines 103.

The second stack 200 may include a plurality of upper selection lines 205 above the second word lines 203. The first word lines 103 and the second word lines 203 may be, for example, in plate form and/or line form. According to example embodiments of the inventive concepts, the respective first word lines 103 and second word lines 203 may be in the shape of a comb-like plate with a local word line cut 13. One of the lower and upper selection lines 101 and 205 may be in the shape of a line and the other may be in the shape of a comb-like plate with the local word line cut 13. According to example embodiments of the inventive concepts, the lower selection line 101 may be in the shape of a comb-like plate with the local word line cut 13 and the upper selection lines 205 may be line-shaped.

Figure 1C:
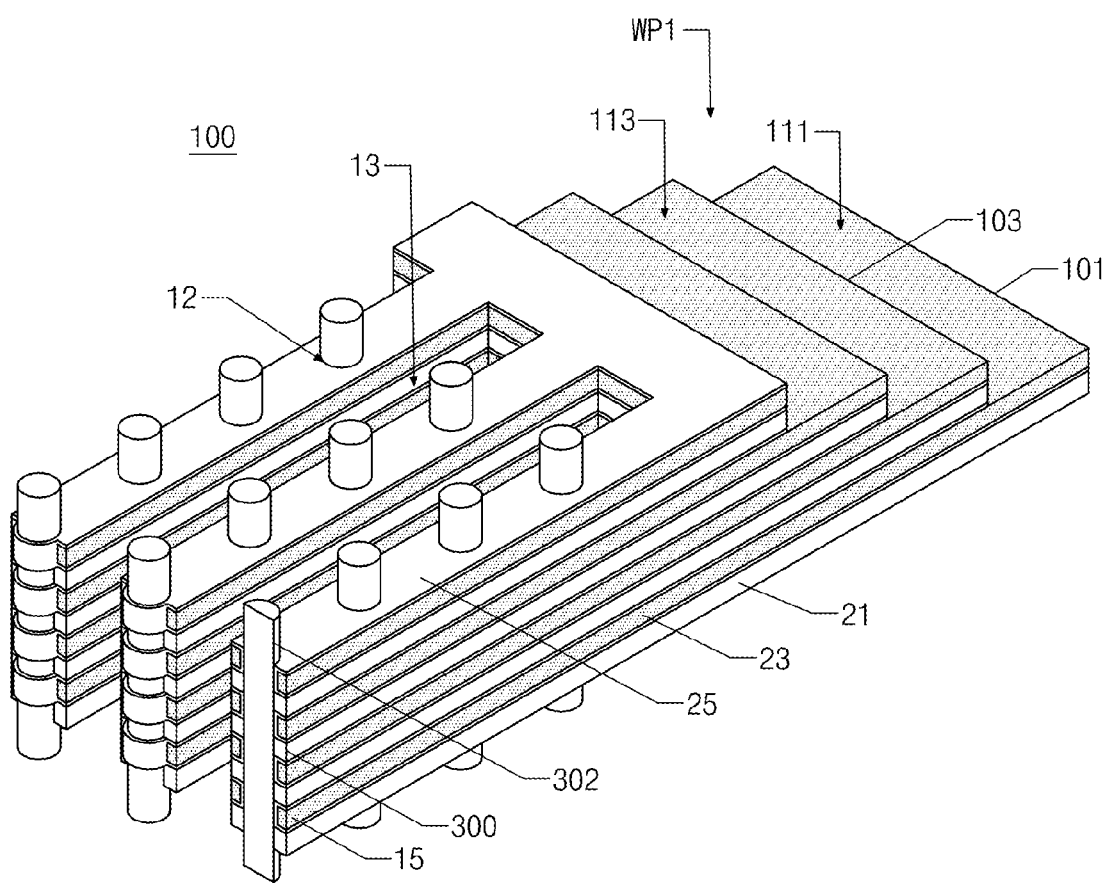
FIGS. 1C and 1D are enlarged perspective views illustrating portions of semiconductor memory devices according to example embodiments of the inventive concepts.
Figure 1D:
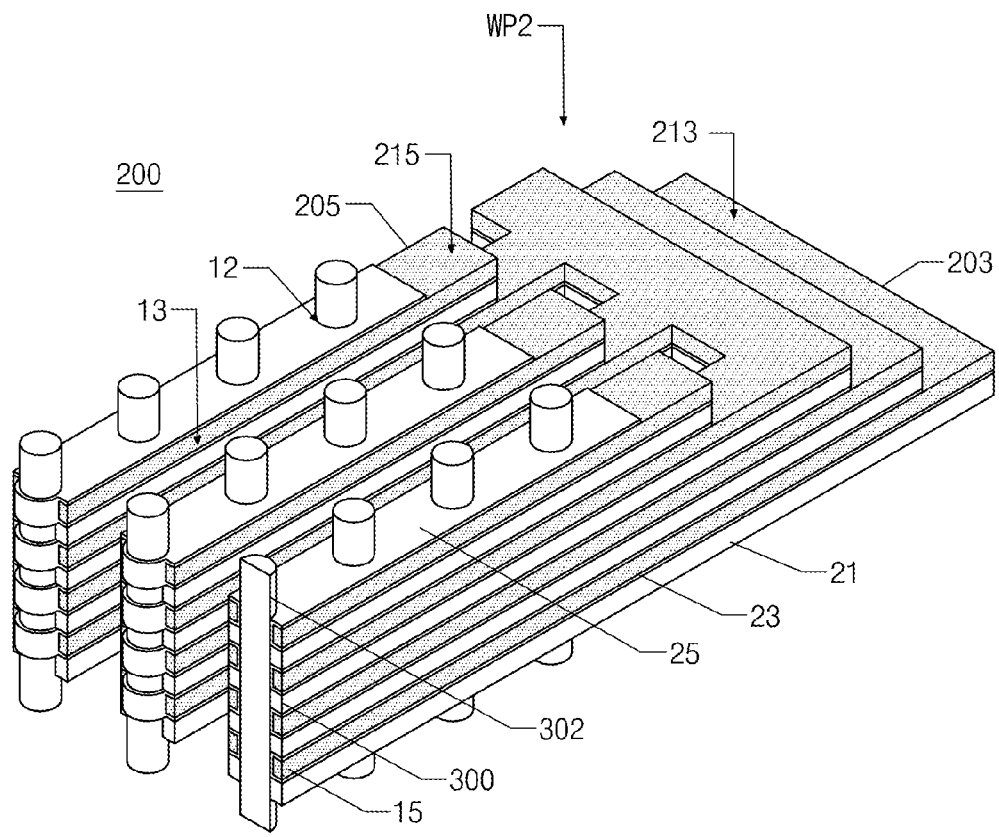

FIGS. 1C and 1D are enlarged perspective views illustrating portions of semiconductor memory devices according to example embodiments of the inventive concepts. Referring to FIG. 1C, the first stack 100 may include vertical transistors 15 defined at intersections where the lower selection line 101 and the first word lines 103 above the lower selection line 101 intersect with vertical channels 300, respectively. For example, a plurality of insulation layers 21 and a plurality of gates 23 may be stacked in a stair form to form the lower selection line 101 and the first word lines 103. The plurality of gates 23 may be patterned in a stair form such that a portion of the gates 23 may be exposed to define a lower selection line contact pad 111 and a plurality of first word line contact pads 113. The lower selection line contact pad 111 and the first word line contact pads 113 may be commonly called first word line pad WP1 for clarity of explanation.

A conductor, for example, polysilicon may fill a plurality of channel holes 12 which vertically penetrate the first word lines 103, and may be the plurality of vertical channels 300. The vertical channels 300 may be, for example, in the shape of a cylinder and/or a polygonal column. An information storage layer 25 may be between the insulation layer 21 and the gate 23, surrounding an outer wall 302 of the vertical channel 300. The plurality of vertical transistors 15 in which the information storage layers 25 are disposed between the gates 23 and the vertical channels 300 may be defined. Among the plurality of the vertical transistors 15, vertical transistors which are connected to the first word lines 103 may be utilized as memory transistors. The vertical transistors 15 may extend in a vertical direction, that is, an extended direction of the vertical channels 300.

Referring to FIG. 1D, the second stack 200 may include a plurality of upper selection lines 205 and a plurality of second word lines 203 stacked below the plurality of upper selection lines 205. As an example, the insulation layers 21 and the gates 23 may be sequentially stacked in a stair form such that the plurality of second word lines 203 with a plurality of second word line contact pads 213 and the upper selection lines 205 with upper selection line contact pads 215 above the upper selection lines 205 may be formed. According to example embodiments of the inventive concepts, the second word line contact pads 213 and the upper selection line contact pads 215 may be commonly called a second word line pad WP2 for convenience.

The information storage layers 25 may be formed between vertical channels 300 and the gates 23 so that the plurality of vertical transistors 15 may be defined along the extended direction of the vertical channels 300. Among the plurality of vertical transistors 15, vertical transistors which are connected to the second word lines 203 may be utilized as memory transistors. Referring to FIG. 1A together with FIG. 1D, the vertical transistors 15 which are connected to each other in series by penetration of the vertical channels 300 through the first and second stacks 100 and 200 between the semiconductor substrate 11 and the bit line 400, may constitute one string. According to example embodiments, a semiconductor memory device 1 may be a vertical NAND flash memory containing a plurality of strings.

Referring to FIGS. 1A and 1B, the first stack 100 may be a stair-shaped structure with the first word line pad WP1 at both left and right sides, respectively. The second stack 200 may have a stair-shaped structure with the second word line pad WP2 at both left and right sides, respectively. As another example, the first stack 100 may be a pyramid structure in which the first word line pad WP1 is at both front and rear sides as well as at both left and right sides, respectively. The second stack 200 may also be a pyramid structure similarly to the first stack 100. It is illustrated for conciseness that the first stack 100 and the second stack 200 are stair-shaped structures at both left and right sides thereof, but it is noted that it may also be applied to the case where, as one example, the first stack 100 and the second stack 200 are pyramid structures.

The first stack 100 may be electrically connected to a lower selection line contact 121 which electrically connects the lower selection line 101 to a lower selection line driving circuit (not shown), and may also be electrically connected to a plurality of first word line contacts 123 which electrically connect the first word lines 103 to a word line driving circuit (not shown). For example, the lower selection line contact 121 may be connected to a lower selection line contact pad 111, and the first word line contacts 123 may be connected to first word line contact pads 113. The second stack 200 may be electrically connected to a plurality of second word line contacts 223 which electrically connect the second word lines 203 to the word line driving circuit, and may be electrically connected to upper selection line contacts 225 which electrically connect the upper selection lines 205 to an upper selection line driving circuit (not shown). As an example, the second word line contacts 223 may be connected to the second word line contact pads 213, and the upper selection line contacts 225 may be connected to the upper selection line contact pads 215.

According to example embodiments of the inventive concepts, the lower selection line contact 121 and the first word line contacts 123 which are in contact with the first stack 100 may be commonly called a first pad contact PC1 for conciseness of description, and the second word line contacts 223 and the upper selection line contacts 225 which are in contact with the second stack 200 may be commonly called a second pad contact PC2. The second stack 200 may be stacked on the first stack 100. Integration density may be improved. In a stack structure, the second stack 200 may provide a space where the first pad contact PC1 is disposed. According to example embodiments of the inventive concepts, the second stack 200 may be shifted on the first stack 100 an area occupied by the first pad contact PC1.

Figure 1E:
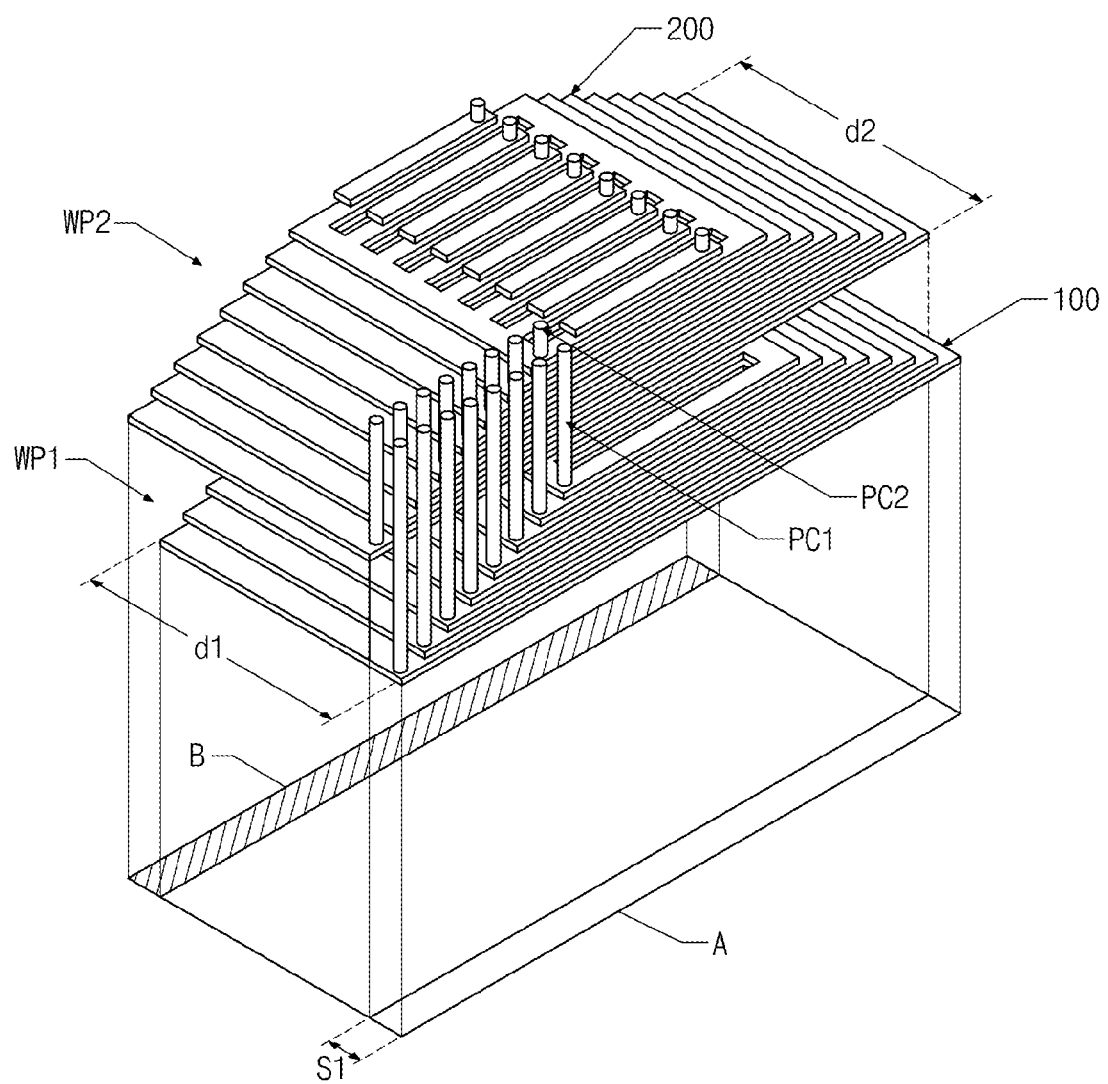
FIG. 1E is a perspective view illustrating stack structures according to example embodiments of the inventive concepts.
Figure 1F:
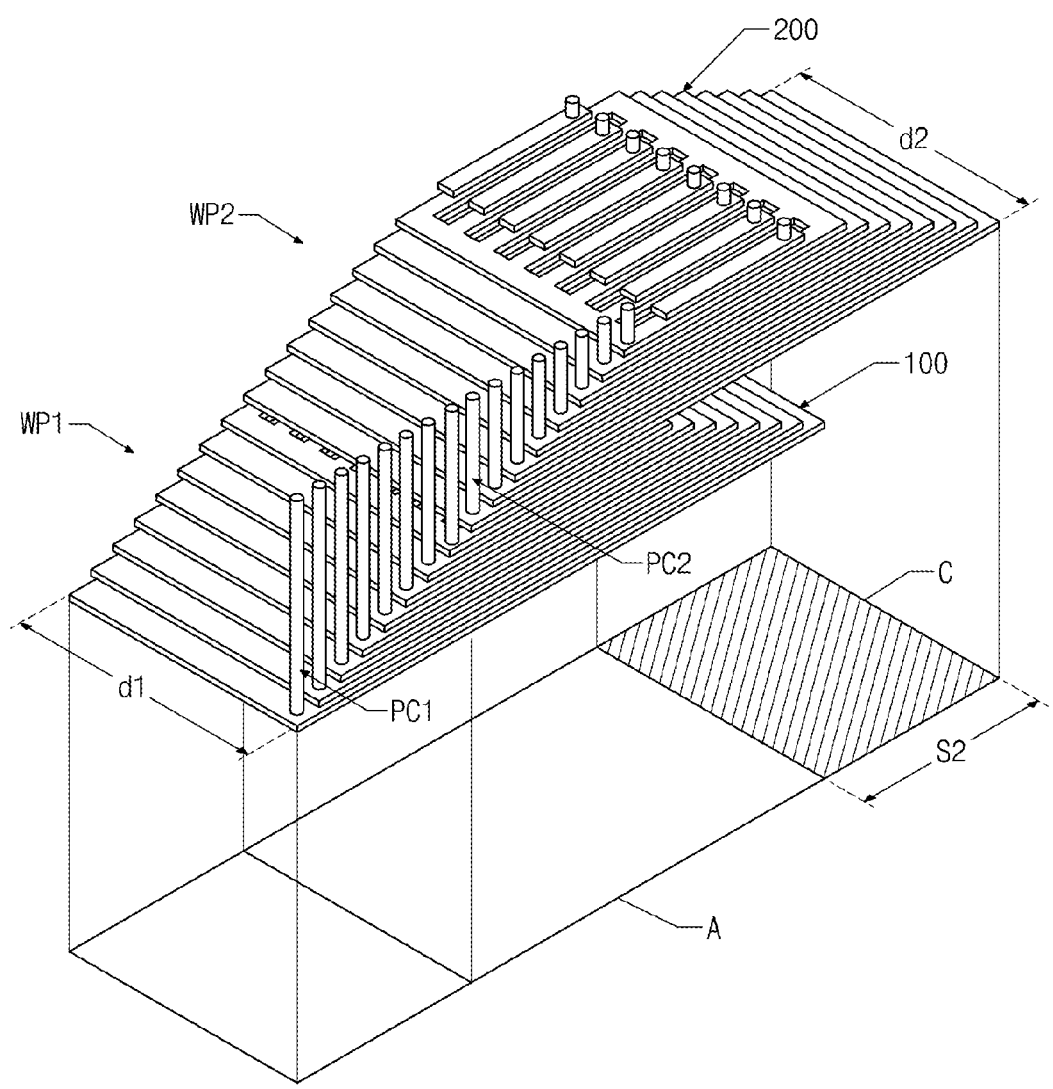
FIG. 1F is a perspective view illustrating stack structures according to other example embodiments of the inventive concepts.

FIG. 1E is a perspective view illustrating stack structures according to example embodiments of the inventive concepts. FIG. 1F is a perspective view illustrating stack structures according to other example embodiments of the inventive concepts. Referring to FIG. 1E, assuming for purposes of explanation that a size d1 of the first stack 100 is equal to a size d2 of the second stack 200 (d1=d2), the second stack 200 may be shifted on the first stack 100 at roughly right angles to a slope direction of stairs such that the first stack 100 may be partially covered with the second stack 200. A portion of the first word line pad WP1 may be exposed and the rest may be covered with the second stack 200.

If a chip area occupied by each of the first stack 100 and the second stack 200 may be A, the total chip area may be A+B. The increased portion of the total chip area A+B may be B. A shift distance S1 of the second stack 200 may depend on the area occupied by the first pad contact PC1. The smaller the area occupied by the first pad contact PC1, the smaller the shift distance S1, and the smaller the chip area B. According to example embodiments of the inventive concepts, the second pad contact PC2 may be shifted as compared to a first pad contact PC1, and the first and second pad contacts PC1 and PC1 may be disposed in the manner of alternation.

Referring to FIG. 1F, assuming for purposes of explanation that a size d1 of the first stack 100 is equal to a size d2 of the second stack 200 (d1=d2), the second stack 200 may be shifted in the slope direction of stairs on the first stack 100 to fully expose the first word line pad WP1 and secure a formation region of the first pad contact PC1. The first word line pad WP1 may be entirely exposed. If a chip area occupied by each of the first stack 100 and the second stack 200 may be A, the total chip area may be A+C. Therefore, the increased portion of the total chip area A+C may be C. A shift size S2 of the second stack 200 may be significantly larger than the shift size S1 illustrated in FIG. 1E because the first contact pad PC1 may be entirely exposed. The chip area increment C may also be larger than the chip area increment B illustrated in FIG. 1E. The second pad contact PC2 may align with the first pad contact PC1 horizontally.

Comparing FIG. 1E with FIG. 1F, integration density may be improved by stacking the second stack 200 on the first stack 100. If the second stack 200 is shifted to expose a side portion of stair structure of the first stack 100 as illustrated in FIG. 1E, an increase in chip area may be reduced as compared to the case where the second stack 200 is shifted to fully expose the first word line pad WP1 to be contacted to the first pad contact PC1 of the first stack 100 as illustrated in FIG. 1F. According to the stack structure of example embodiments of the inventive concepts, chip integration density may be improved without a large increase in chip size. As illustrated in FIG. 1E, if the second stack 200 is stacked on a first stack 100, the integration density will be arithmetically increased about twice.

Figure 1G:
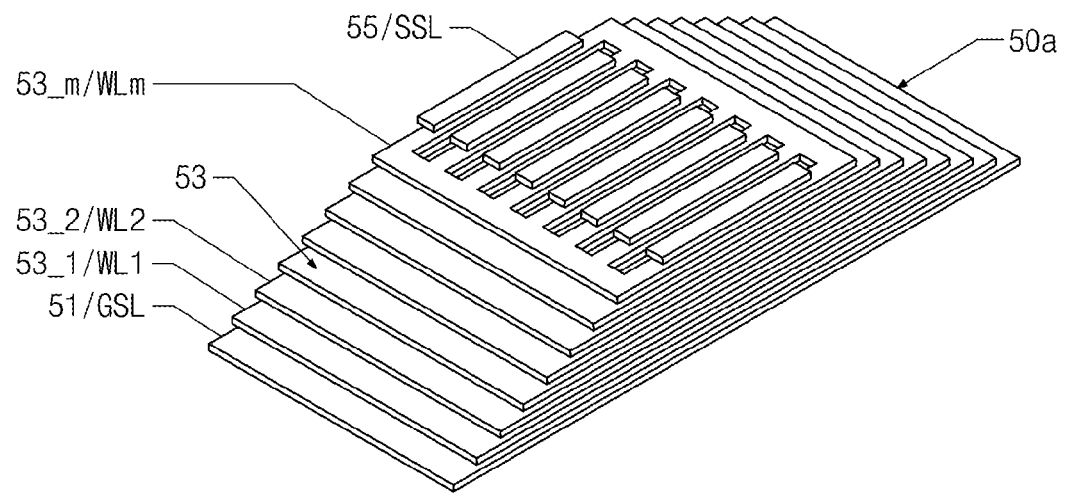
FIG. 1G is a perspective view illustrating general one-stack structures.
Figure 1H:
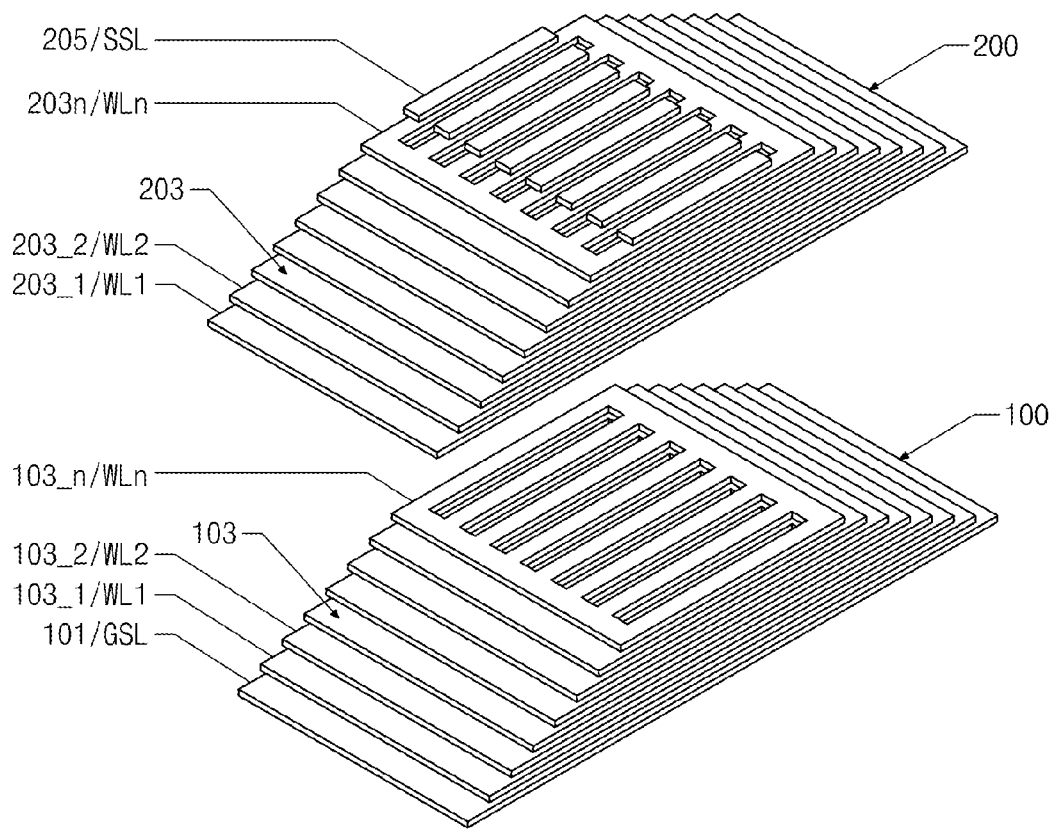
FIG. 1H is a perspective view illustrating integration density improvement according to example embodiments of the inventive concepts.

FIG. 1G is a perspective view illustrating general one-stack structures. FIG. 1H is a perspective view illustrating integration density improvement according to example embodiments of the inventive concepts. Referring to FIG. 1G, it may be assumed for purposes of explanation that a stack 50a includes 17 layers, that "m" word lines 53 may be included between a lower selection line 51 (e.g., ground selection line GSL) and an upper selection line 55 (e.g., string selection line SSL), and "m" may be 15. An effective word line used as an actual memory cell may be 15 layers.

Referring to FIG. 1H, it may be assumed for purposes of explanation that each of first and second stacks 100 and 200 includes 17 layers similarly to the stack 50a. There may be "n" layers of first word lines 103 stacked above the lower selection line 101 in the first stack 100, "n" layers of second word lines 203 stacked below the upper selection line 205 in the second stack 200, and "n" may be 16. When the second stack 200 is stacked on the first stack 100, two layers corresponding to the selection lines 101 and 205, which may not be used as effective word lines among a total of 34 layers, may be excluded during the calculation of the integration density.

Comparing with FIGS. 1G and 1H, although the stack 50a includes 15 layers of effective word lines in the case where stacks 50a, 100 and 200 are identically composed of 17 layers, the effective word line is 32 layers in the structure in which the second stack 200 is stacked on the first stack 100, thus 2 layers may be further included as the effective word line (e.g., there may be 2 less selection lines due to stacking in FIG. 1H than if 2 stacks 50a are used). The integration density may be increased more than twice, for example, about 2.13 times for stacks 100 and 200 configured according to example embodiments.

Figure 1I:
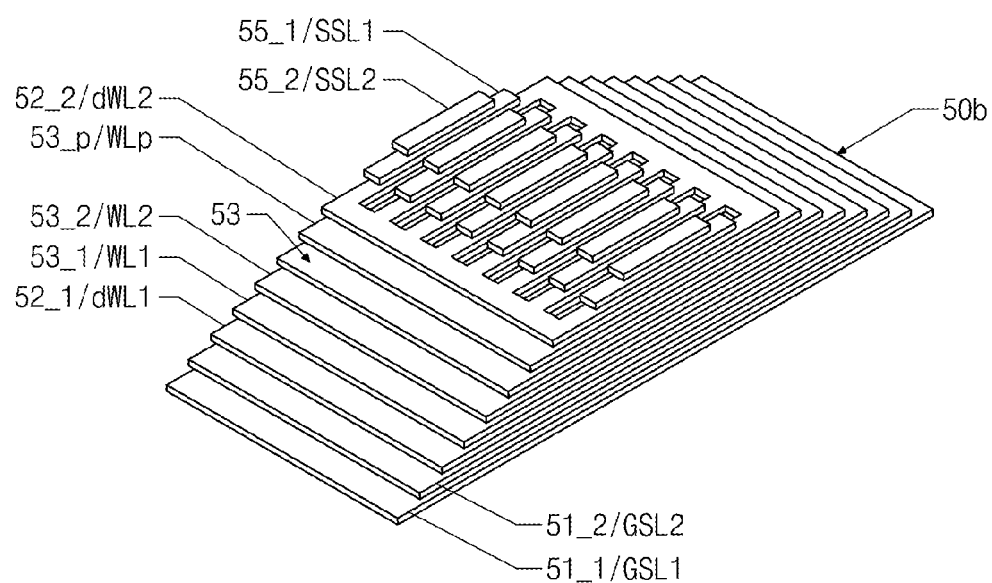
FIG. 1I is a perspective view illustrating general one-stack structures.
Figure 1J:
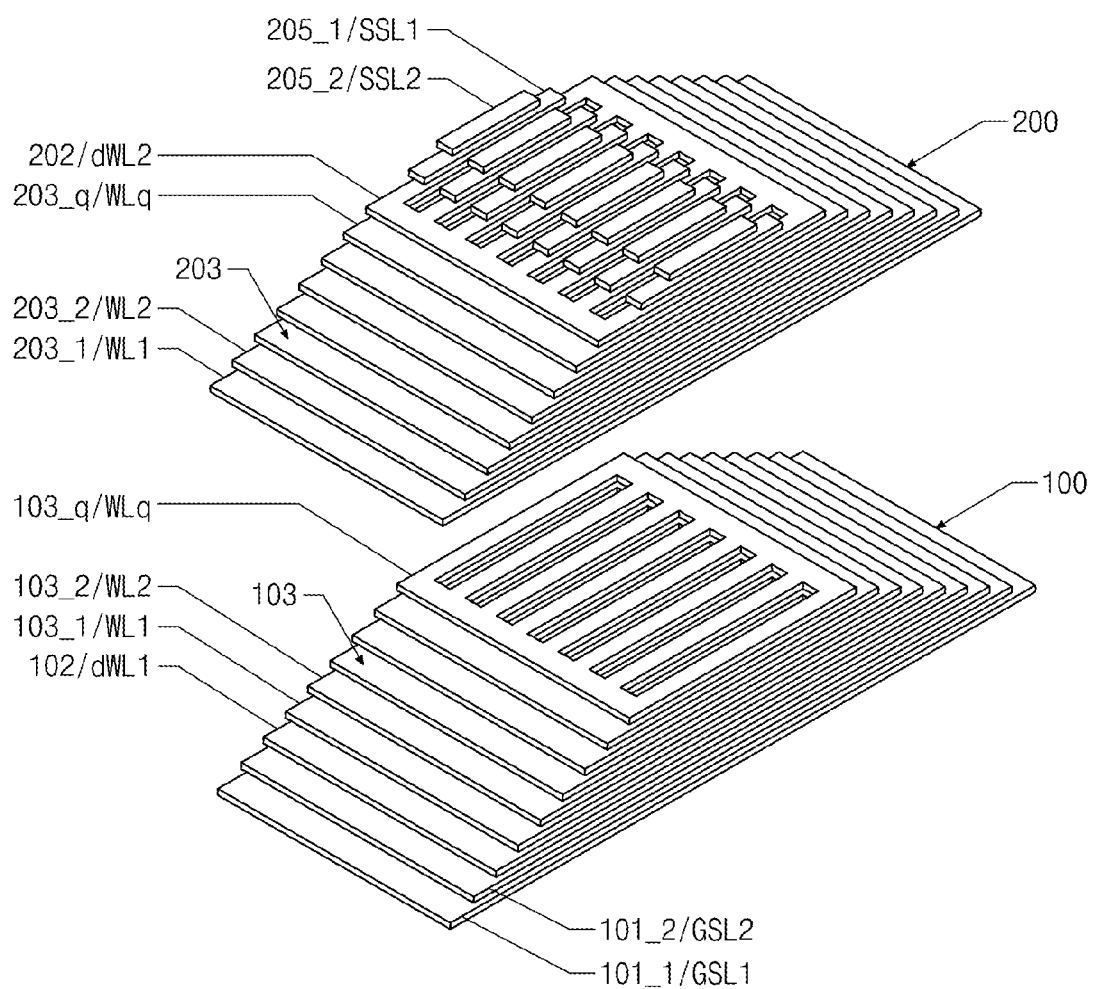
FIG. 1J is a perspective view illustrating integration density improvement according to other example embodiments of the inventive concepts.

FIG. 1I is a perspective view illustrating general one-stack structures. FIG. 1J is a perspective view illustrating integration density improvement according to other example embodiments of the inventive concepts. Referring to FIG. 1I, it may be assumed for the purposes of explanation that a stack 50b may be composed of 17 layers and may include a plurality of selection lines and a plurality of dummy word lines. As an example, the stack 50b may include "p" layers of word lines 53 between 2 layers of lower selection lines 51_1 and 51_2 and 2 layers of upper selection lines 55_1 and 55_2, and may include one layer of an upper dummy word line 52_2 and one layer of a lower dummy word line 52_1 at both top and bottom layers of word lines 53. In this case, "p" may be 11 such that 11 layers of effective word lines are disposed.

Referring to FIG. 1J, it may be assumed for purposes of explanation that each of the first stack 100 and the second stack 200 may be composed of 17 layers. As an example, "q" layers of first word lines 103 may be stacked above 2 layers of lower selection lines 101_1 and 101_2 in the first stack 100, and one layer of a lower dummy word line 102 may be below the first word lines 103. In the second stack 200, "q" layers of second word lines 203 may be stacked below 2 layers of upper selection lines 205_1 and 205_2, and one layer of an upper dummy word line 202 may be above the second word lines 203. In this case, "q" may be 14 and thus an effective number of word layers may be 28 layers. When the second stack 200 is stacked on the first stack 100, 6 layers corresponding to the lower selection lines 101_1 and 101_2, upper selection lines 205_1 and 205_2 and dummy word lines 102 and 202, which are not used as an effective word line among total 34 layers, may be excluded in a calculation of integration density.

Comparing with FIGS. 1I and 1J, although the stack 50b nay include 11 layers of effective word lines in the case where stacks 50b, 100 and 200 are each composed of 17 layers, the effective word line may be 28 layers in the structure in which the second stack 200 is stacked on the first stack 100, with 6 layers more of effective word lines as compared to two stacks 50b. The integration density may be increased more than twice, for example, about 2.55 times for stacks 100 and 200 according to example embodiments.

Referring to FIGS. 1A and 1B, the semiconductor memory device 1 may include first metal interconnections 141 and 143 which connect the first pad contact PC1 to a lower selection line driving circuit and a word line driving circuit, and second metal interconnections 243 and 245 which connect the second pad contact PC2 to the word line driving circuit and an upper selection line driving circuit. As an example, the first metal interconnections 141 and 143 may be classified into a first selection line metal interconnection 141 and first word line metal interconnections 143. The first selection line metal interconnection 141 may connect the lower selection line contact 121 to the lower selection line driving circuit, and the first word line metal interconnections 143 may connect the first word line contacts 123 to the word line driving circuit. Similarly, the second metal interconnections 243 and 245 may be classified into second word line metal interconnections 243 and second selection line metal interconnections 245. The second word line metal interconnections 243 may connect the second word line contacts 223 to the word line driving circuit, and the second selection line metal interconnections 245 may connect the upper selection line contacts 225 to the upper selection line driving circuit.

According to example embodiments of the inventive concepts, the first word line metal interconnections 143 and the second word line metal interconnections 243 may be alternately disposed on the stair structure at one side of the second stack 200. For example, the second word line metal interconnections 243 may be at odd-numbered (or even-numbered) positions, and the first word line metal interconnections 143 may be at even-numbered (or odd-numbered) positions. The first selection line metal interconnection 141 may be at the side of the second word line metal interconnection 243 as the last (or the first) interconnection. The second selection line metal interconnections 245 may be on the stair structure at the other side of the second stack 200.

First intermediate metal interconnections 131 and 133 may be between the first pad contact PC1 and the first metal interconnections 141 and 143, and second intermediate metal interconnections 233 and 235 may be further provided between the second pad contact PC2 and the second metal interconnections 243 and 245. For example, the first intermediate metal interconnections 131 and 133 may include a first intermediate selection line metal interconnection 131 connected to the lower selection line contact 121 and first intermediate word line metal interconnections 133 connected to the first word line contacts 123. The second intermediate metal interconnections 233 and 235 may include a second intermediate word line metal interconnection 233 connected to the second word line contacts 223 and second intermediate selection line metal interconnections 235 connected to the upper selection line contacts 225.

According to example embodiments of the inventive concepts, the first intermediate word line metal interconnections 133 and the second intermediate word line metal interconnections 233 may be alternately disposed on the stair structure at one side of the second stack 200. For example, the second intermediate word line metal interconnections 233 may be at odd-numbered (or even-numbered) positions, and the first intermediate word line metal interconnections 133 may be at an even-numbered (or odd-numbered) position. The first intermediate selection line metal interconnection 131 may be at the side of the second intermediate word line metal interconnection 233 as the last (or the first) interconnection.

The second intermediate selection line metal interconnections 235 may be on the stair structure at the other side of the second stack 200. For the conciseness of description, the first intermediate metal interconnections 131 and 133 and the second intermediate metal interconnections 233 and 235 may be commonly called first metal M1, and the first metal interconnections 141 and 143 and the second metal interconnections 243 and 245 may be commonly called second metal M2. As another example, the semiconductor memory device 1 may not include the local word line cut 13. According to these example embodiments, the first word line 103 and the second word line 203 may be in a plate form, any one of the lower selection line 101 and the upper selection line 205 may be in a plate form and the other one may be in a line form. For example, the lower selection line 101 may be in a plate form and the upper selection line 205 may be in a line form, or vice versa.

Figure 1K:
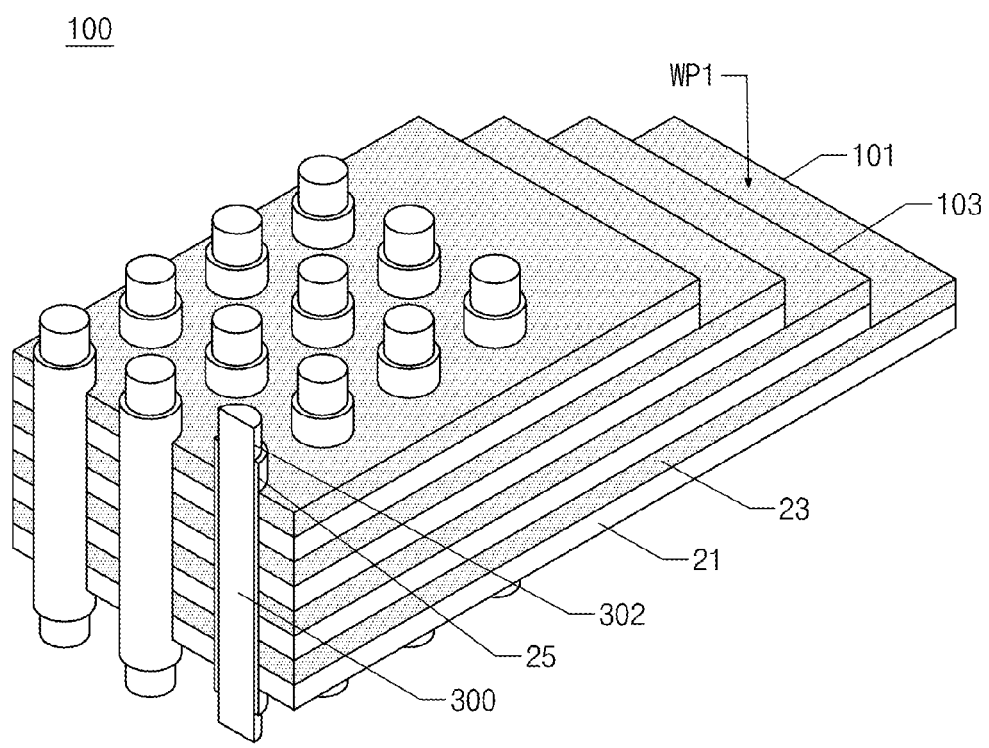
FIGS. 1K and 1L are enlarged perspective views illustrating portions of semiconductor memory devices according to other example embodiments of the inventive concepts.
Figure 1L:
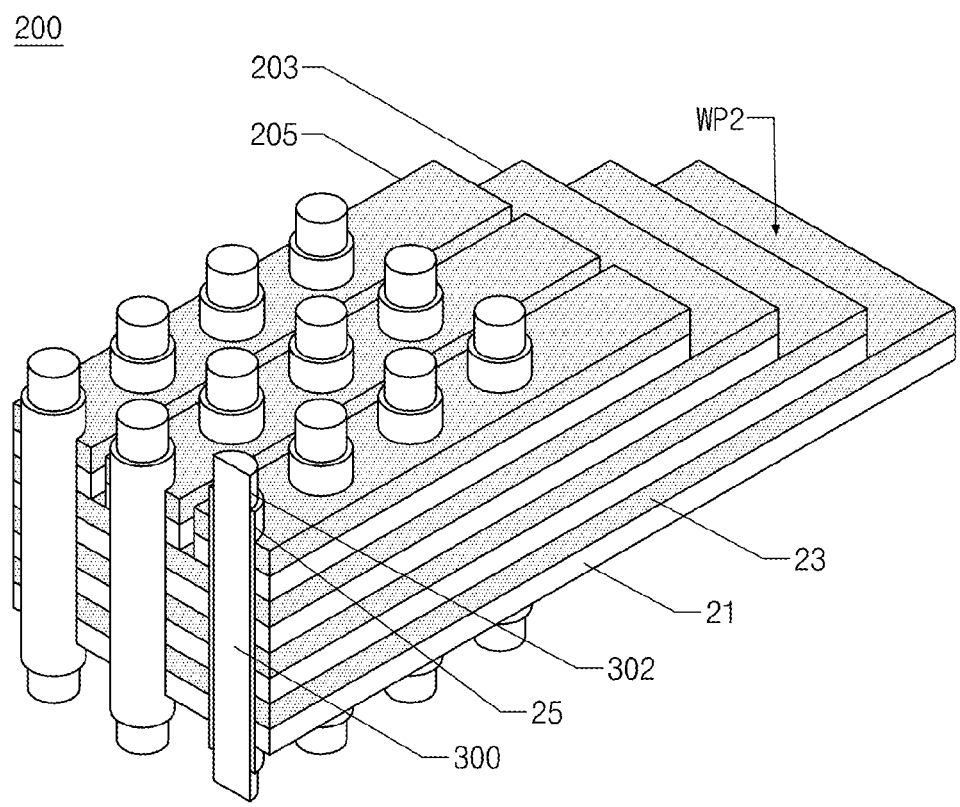

FIGS. 1K and 1L are enlarged perspective views illustrating portions of semiconductor memory devices according to other example embodiments of the inventive concepts. Referring to FIG. 1K, by stacking insulation layers 21 and gates 23 in turn, a first stack 100 may include a plate-shaped lower selection line 101, plate-shaped first word lines 103, and stair-like first word line pads WP1. The information storage layer 25 may surround an outer surface 302 along a longitudinal direction of a vertical channel 300. Referring to FIG. 1L, by stacking the insulation layers 21 and the gates 23 in turn, a second stack 200 may include plate-shaped second word lines 203, line-shaped upper selection lines 205, and stair-like second word line pads WP2.

Figure 2A:
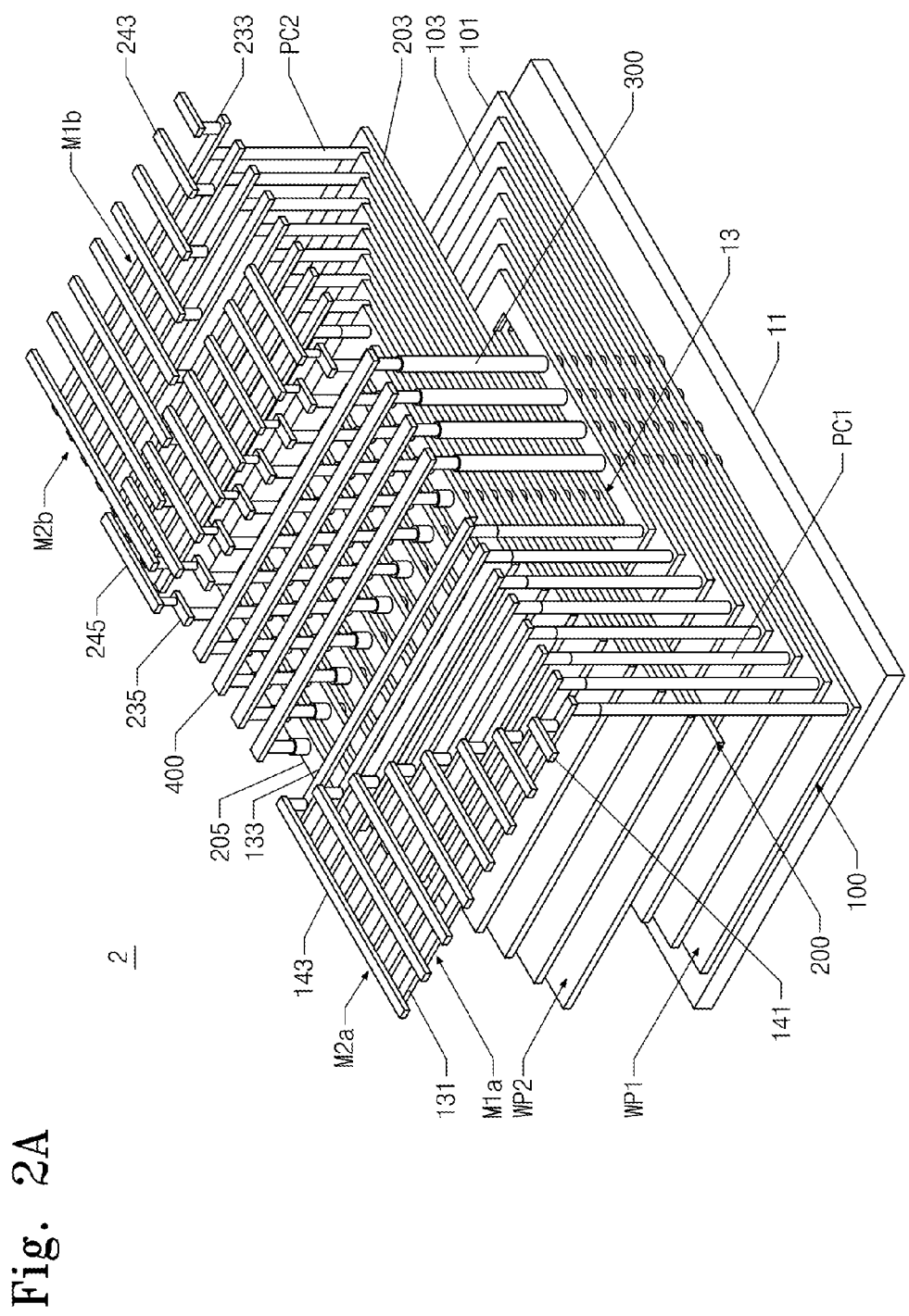
FIGS. 2A and 2B are perspective views illustrating semiconductor memory devices according to other example embodiments of the inventive concepts.
Figure 2B:
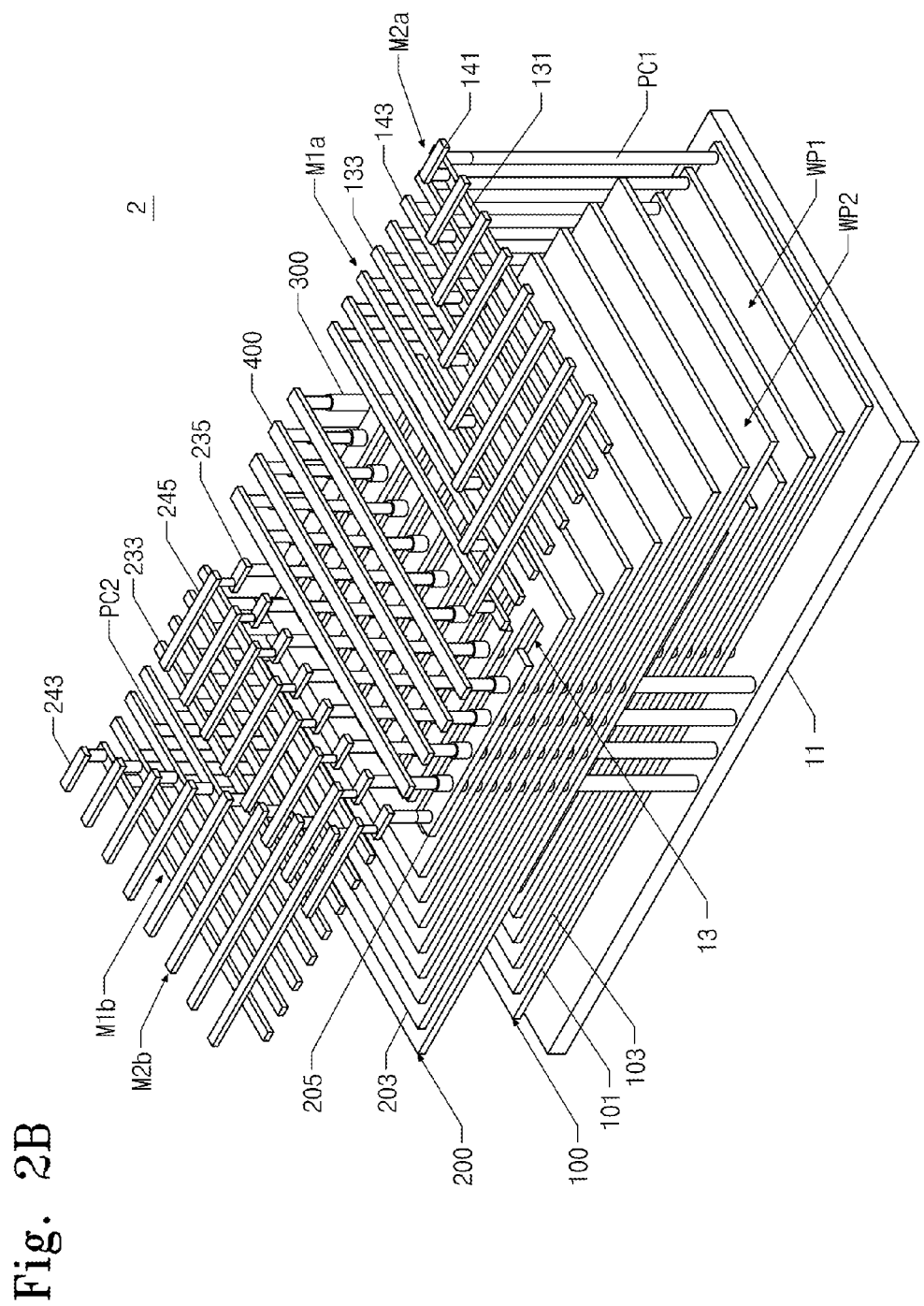

FIGS. 2A and 2B are perspective views illustrating semiconductor memory devices according to other example embodiments of the inventive concepts. Referring to FIGS. 2A and 2B, a semiconductor memory device 2 according to example embodiments may include a first pad contact PC1 and a second pad contact PC2 at left and right sides of a bit line 400. As an example, the first pad contact PC1 may be connected to a first word line pad WP1 and may be a left (or front) stair of a first stack 100. The second pad contact PC2 may be connected to a second word line pad WP2 and may be a right (or rear) stair of a second stack 200. Example embodiments may include utilizing the left side of the first word line pad WP1 as a part contacting the first pad contact PC1 and the right side of the second word line pad WP2 as a part contacting the second pad contact PC2.

First metals M1a and M1b and/or second metals M2a and M2b may also be at the left and right sides of the bit line 400. Of the first metals M1a and M1b, a left side first metal M1a may include a first intermediate lower selection line metal interconnection 131 and first intermediate word line metal interconnections 133 which are electrically connected to the first pad contact PC1, and a right side first metal M1b may include second intermediate word line metal interconnections 233 and second intermediate selection line metal interconnections 235 which are electrically connected to the second pad contact PC2.

Similarly, of the second metals M2a and M2b, a left side second metal M2a may include a first selection line metal interconnection 141 and first word line metal interconnections 143 which are electrically connected to the left side first metal M1a, and a right side second metal M2b may include second word line metal interconnections 243 and second selection line metal interconnections 245 which are electrically connected to the right side first metal M1b. The second word line metal interconnections 243 and the second selection line metal interconnections 245 may be alternately disposed. As another example, the second selection line metal interconnections 245 may be disposed at a higher level than the second word line metal interconnections 243.

Figure 3A:
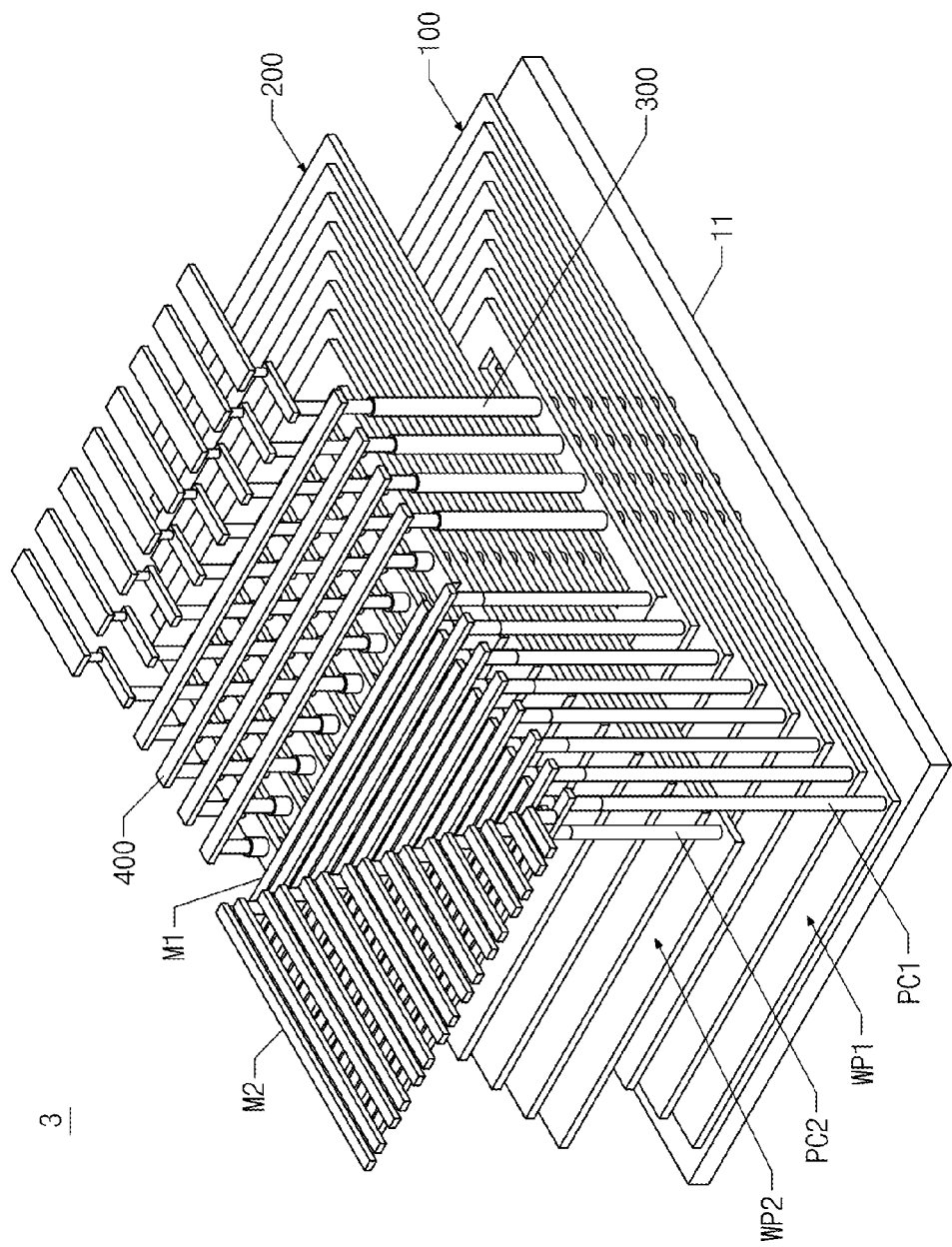
FIGS. 3A and 3B are perspective views illustrating semiconductor memory devices according to other example embodiments of the inventive concepts.
Figure 3B:
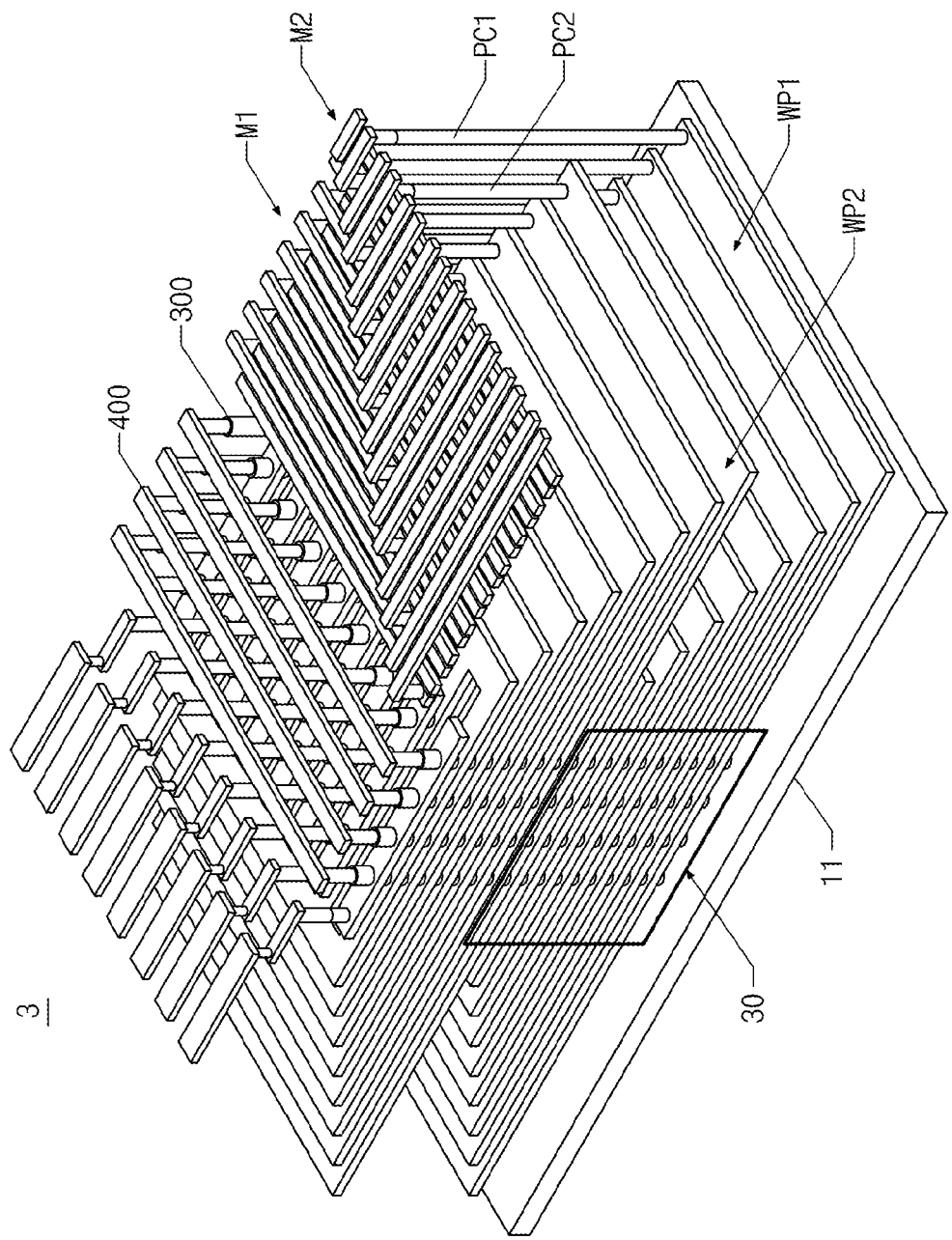
Figure 3C:
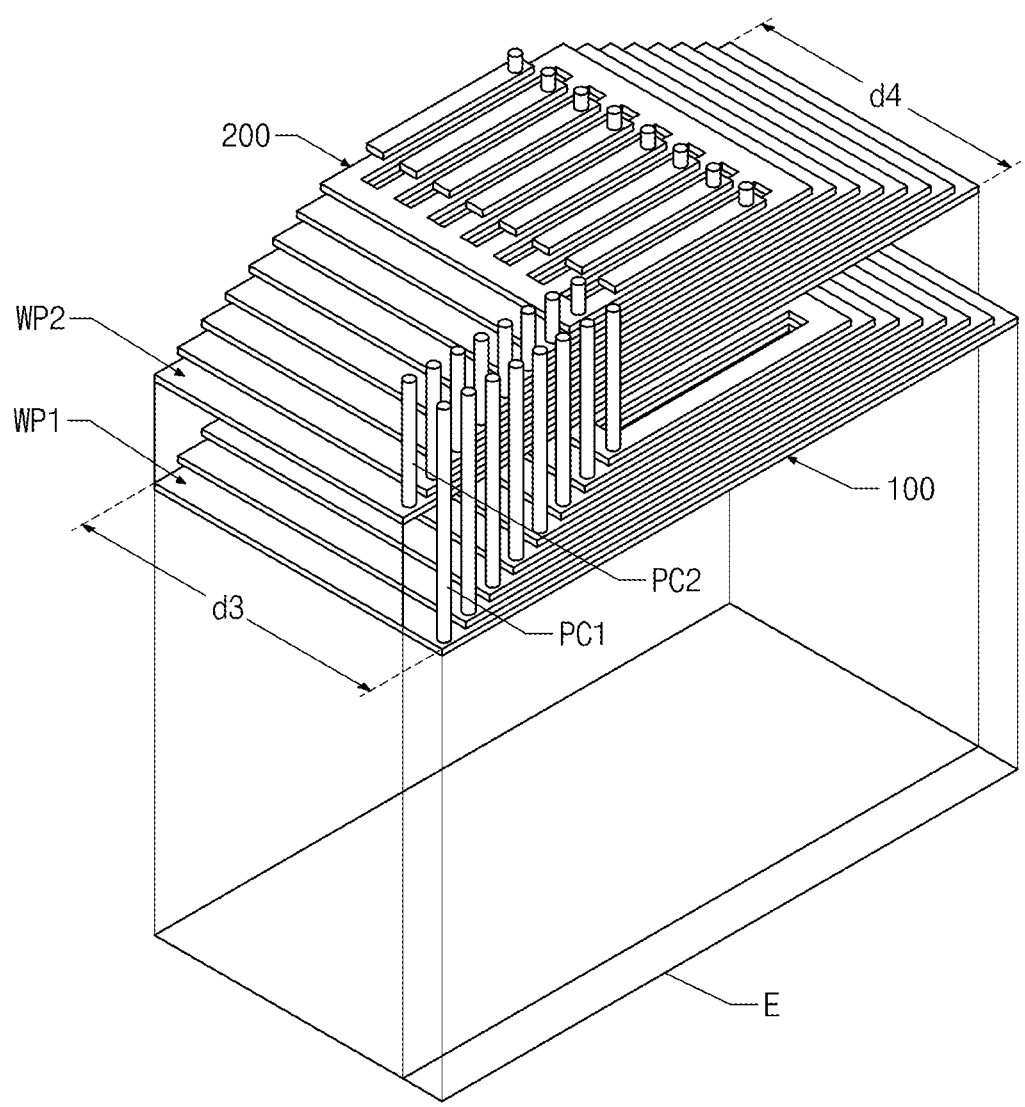
FIG. 3C is a perspective view illustrating stack structures according to other example embodiments of the inventive concepts.

FIGS. 3A and 3B are perspective views illustrating semiconductor memory devices according to other example embodiments of the inventive concepts. FIG. 3C is a perspective view illustrating stack structures according to other example embodiments of the inventive concepts. Referring to FIGS. 3A and 3B, a semiconductor memory device 3 according to example embodiments may include a first stack 100 of a relatively large size, and a second stack 200 of a relatively small size which is shifted on the first stack 100. According to example embodiments, a left end of the first stack 100 may be aligned with a left end of the second stack 200, and a right end of the first stack 100 may not be aligned with a right end of the second stack 200. A stacked configuration of the first stack 100 and the second stack 200 according to example embodiments will be described with reference to FIG. 3C.

Referring to FIG. 3C, assuming for purposes of explanation that the size d4 of the second stack 200 is smaller than the size d3 of the first stack 100 (d3>d4), although a portion of a first word line pad WP1 is exposed by shifting the second stack 200, a chip area E may not be changed unlike FIG. 1E. Referring to FIG. 1E and FIG. 3C, assuming d3=d1, a chip area may increase from A to A+B in case of FIG. 1E, however, example embodiments according to FIG. 3C may facilitate the chip area E to be unchanged, improving the integration density. According to example embodiments, an overlap area between the first stack 100 and the second stack 200 may be further increased as compared to the case of FIG. 1E.

Referring to FIG. 3B together with FIG. 1B, according to example embodiments illustrated in FIG. 3B, an overlap area between the first stack 100 and the second stack 200 may be increased. As a result, a vertical channel 300 in the increased overlap region 30 may be used as an actual operating channel, and therefore may improve integration density. The stacked configuration of the first stack 100 and the second stack 200 according to the example embodiments may be applied to the semiconductor memory device 2 in FIG. 2A, and may also be applied to various example embodiments in general.

Figure 4A:
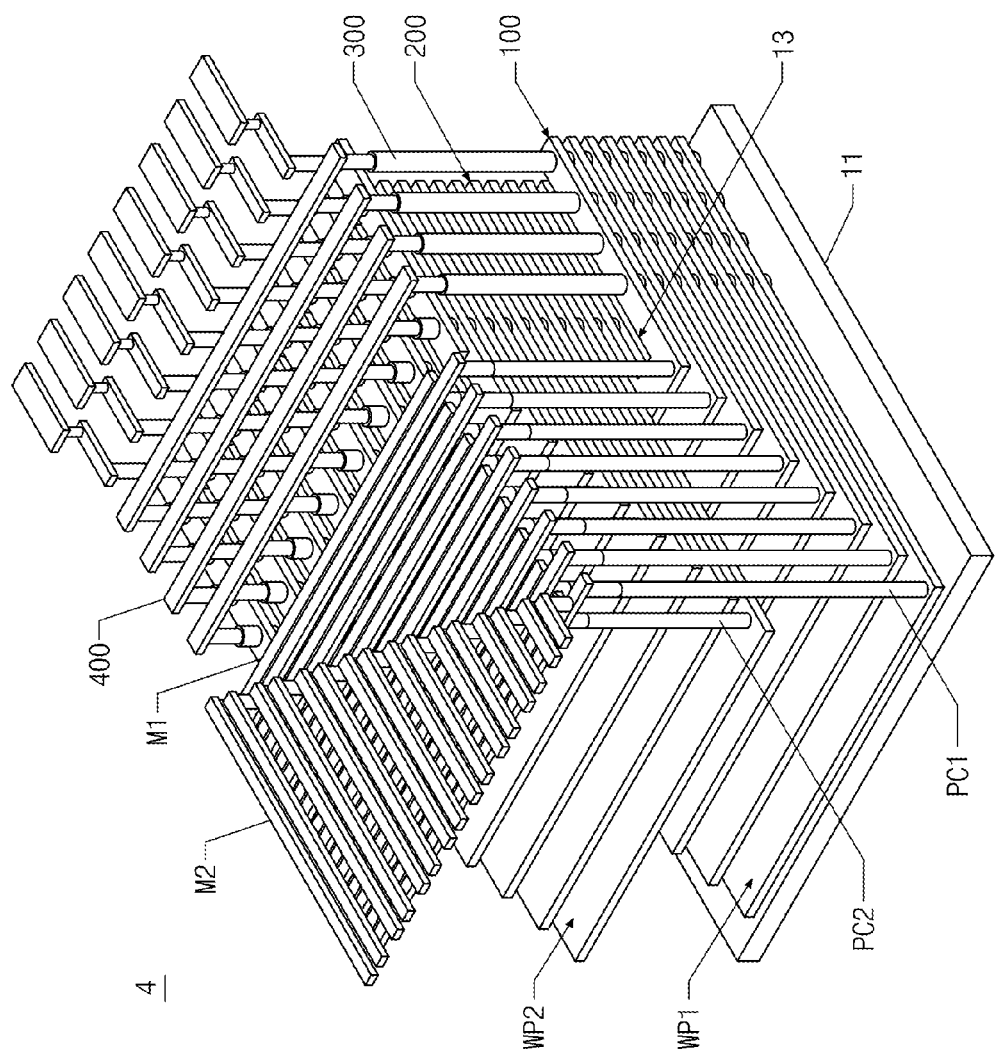
FIGS. 4A and 4B are perspective views illustrating semiconductor memory devices according to other example embodiments of the inventive concepts.
Figure 4B:
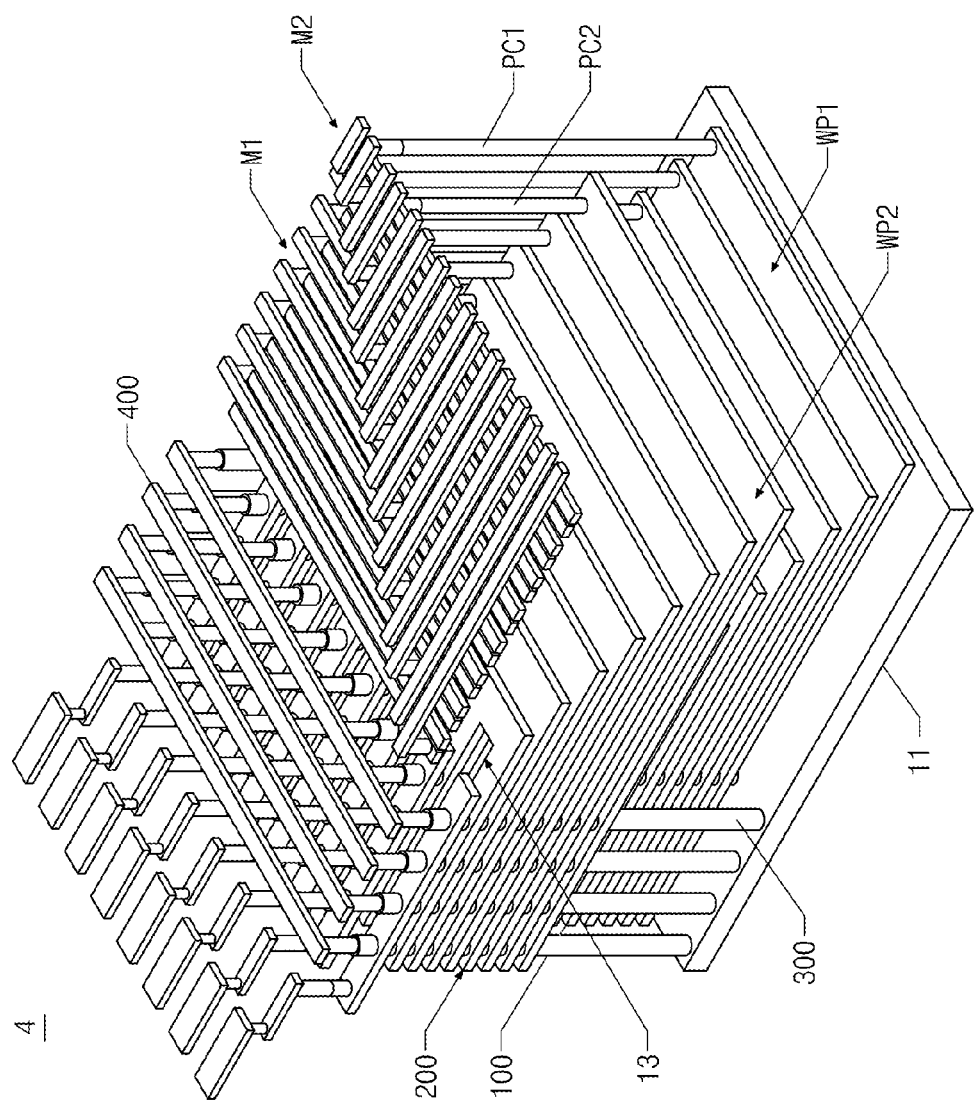

FIGS. 4A and 4B are perspective views illustrating semiconductor memory devices according to other example embodiments of the inventive concepts. Referring to FIGS. 4A and 4B, a semiconductor memory device 4 may include a first stack 100 with a stair structure at one side thereof, and a second stack 200 with a stair structure at one side thereof, which is shifted on the first stack 100. A first word line pad WP1 may be shielded by a second word line pad WP2, but may be partially exposed so that a region contacting a first pad contact PC1 may be secured. A second pad contact PC2 may be with the first pad contact PC1 in an alternating manner.

Figure 5A:
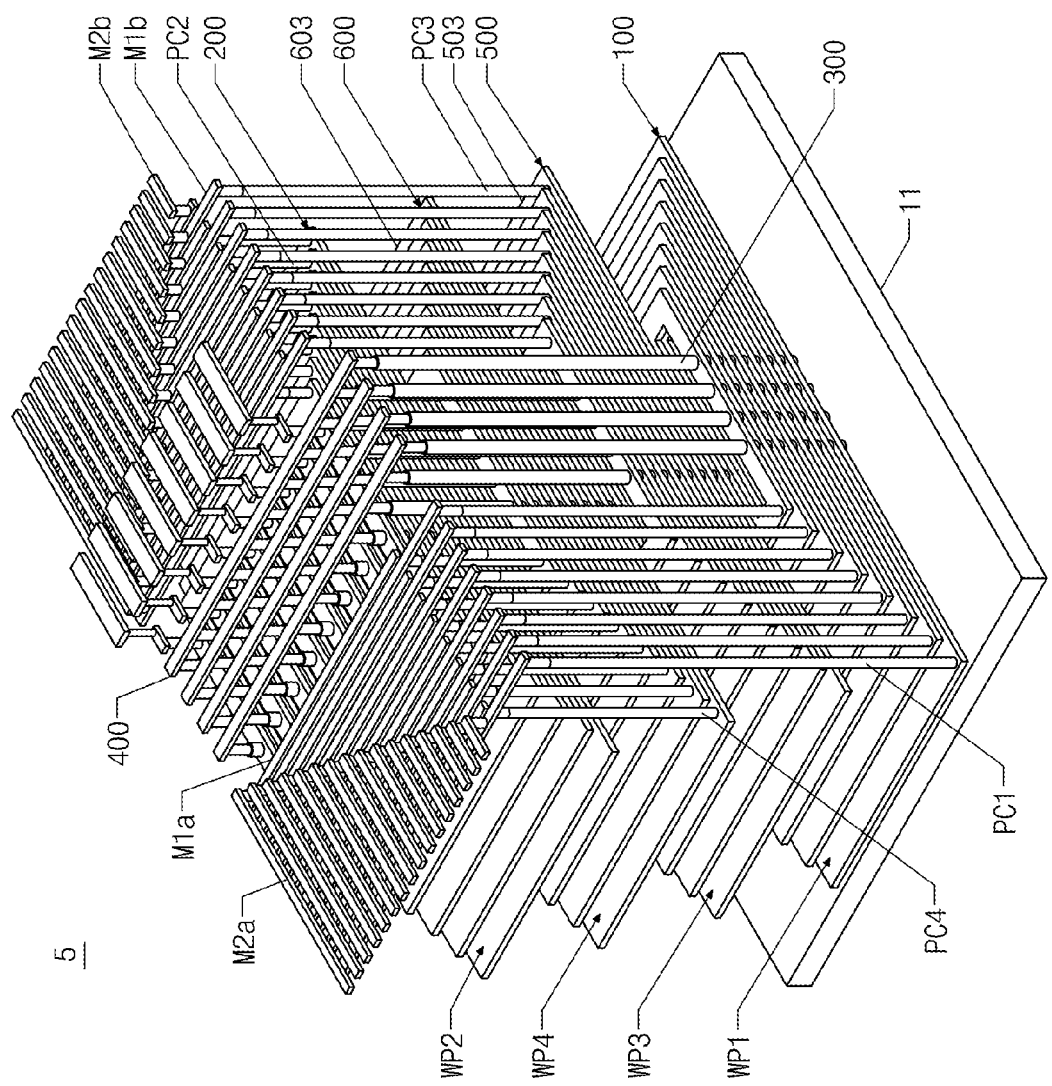
FIGS. 5A and 5B are perspective views illustrating semiconductor memory devices according to other example embodiments of the inventive concepts.
Figure 5B:
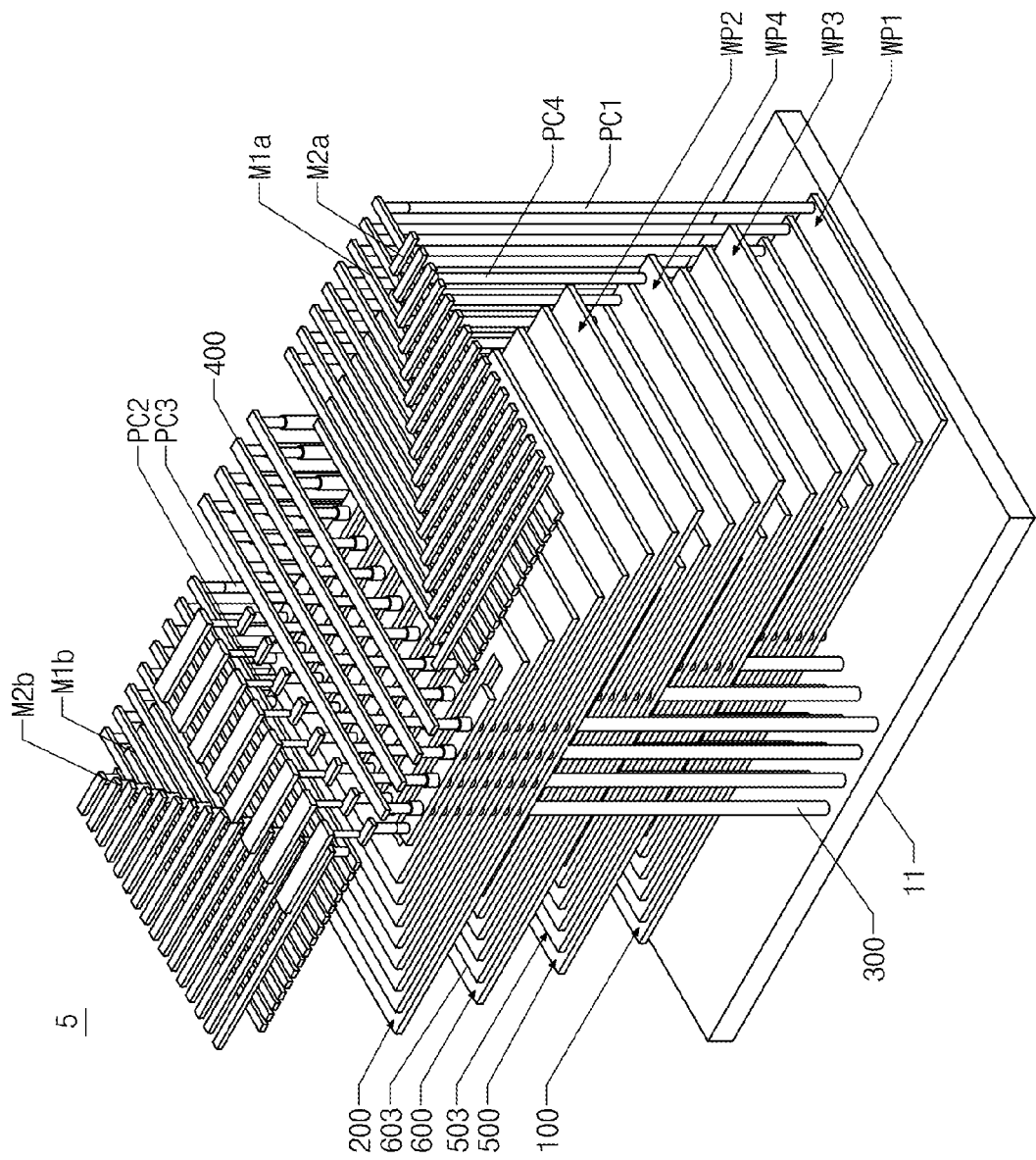

FIGS. 5A and 5B are perspective views illustrating semiconductor memory devices according to other example embodiments of the inventive concepts. Referring to FIGS. 5A and 5B, a semiconductor memory device 5 according to example embodiments may be a four-stack structure in which a third stack 500 and a fourth stack 600 may be provided between a first stack 100 and a second stack 200. The third stack 500 may include a plurality of effective word lines 503 each of which includes a third word line pad WP3. The fourth stack 600 may also include a plurality of effective word lines 603 each including a fourth word line pad WP4.

The third stack 500 may be stacked on the first stack 100, the fourth stack 600 may be stacked on the third stack 500, and the second stack 200 may be stacked on the fourth stack 600, in a shifted fashion, respectively. A third word line pad WP3 may cover a portion of a first word line pad WP1 to thereby expose a portion of a side of the first word line pad WP1 which may contact a first pad contact PC1, a fourth word line pad WP4 may cover a portion of the third word line pad WP3 to thereby expose a portion of a side of the third word line pad WP3 which may contact a third pad contact PC3, and a second word line pad WP2 may cover a portion of the fourth word line pad WP4 to expose a portion of a side of the fourth word line pad WP4 which may contact a fourth pad contact PC4. As an example, the first pad contact PC1 and the fourth pad contact PC4 may be at the left side, and the third pad contact PC3 and the second pad contact PC2 may be at the right side of the semiconductor memory device 5.

Identically or similarly to the description explained in FIGS. 2A and 2B, first metals M1a and M1b and/or second metals M2a and M2b may be at left and right sides of a bit line 400. As an example, a left side first metal M1a may contact the first pad contact PC1 and the fourth pad contact PC4, and a right side first metal M1b may contact the third pad contact PC3 and the second pad contact PC2. The left side second metal M2a may be electrically connected to the first pad contact PC1 and the fourth pad contact PC4, and the right side second metal M2b may be electrically connected to the third pad contact PC3 and the second pad contact PC2. As another example, the first pad contact PC1 and the third pad contact PC3 may be at the left side, and the second pad contact PC2 and the fourth pad contact PC4 may be at the right side. As another example, the first pad contact PC1 and the second pad contact PC2 may be at the left side, and the third pad contact PC3 and the fourth pad contact PC4 may be at the right side.

Figure 5C:
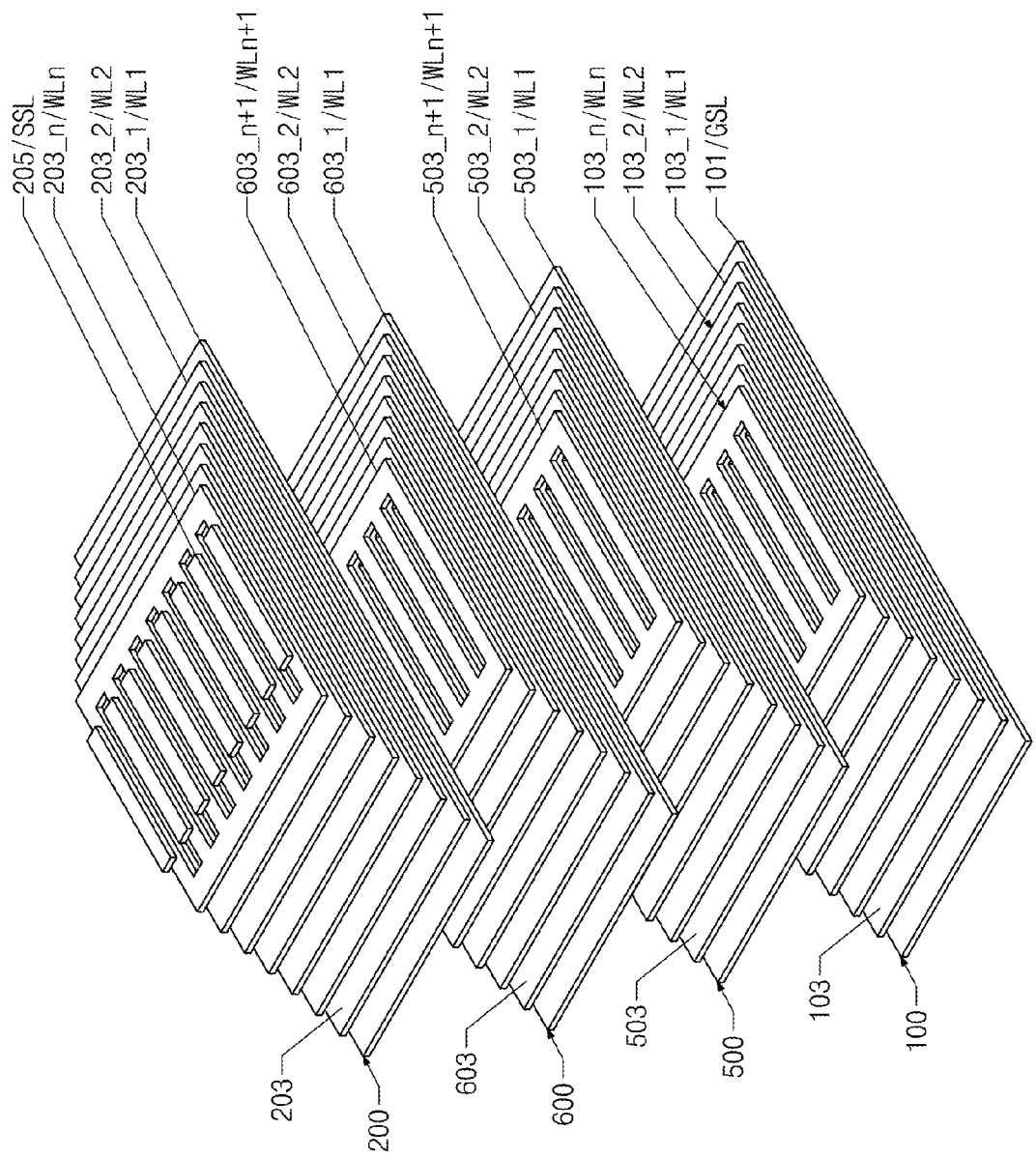
FIGS. 5C and 5D are perspective views illustrating integration density improvement according to other example embodiments of the inventive concepts.
Figure 5D:
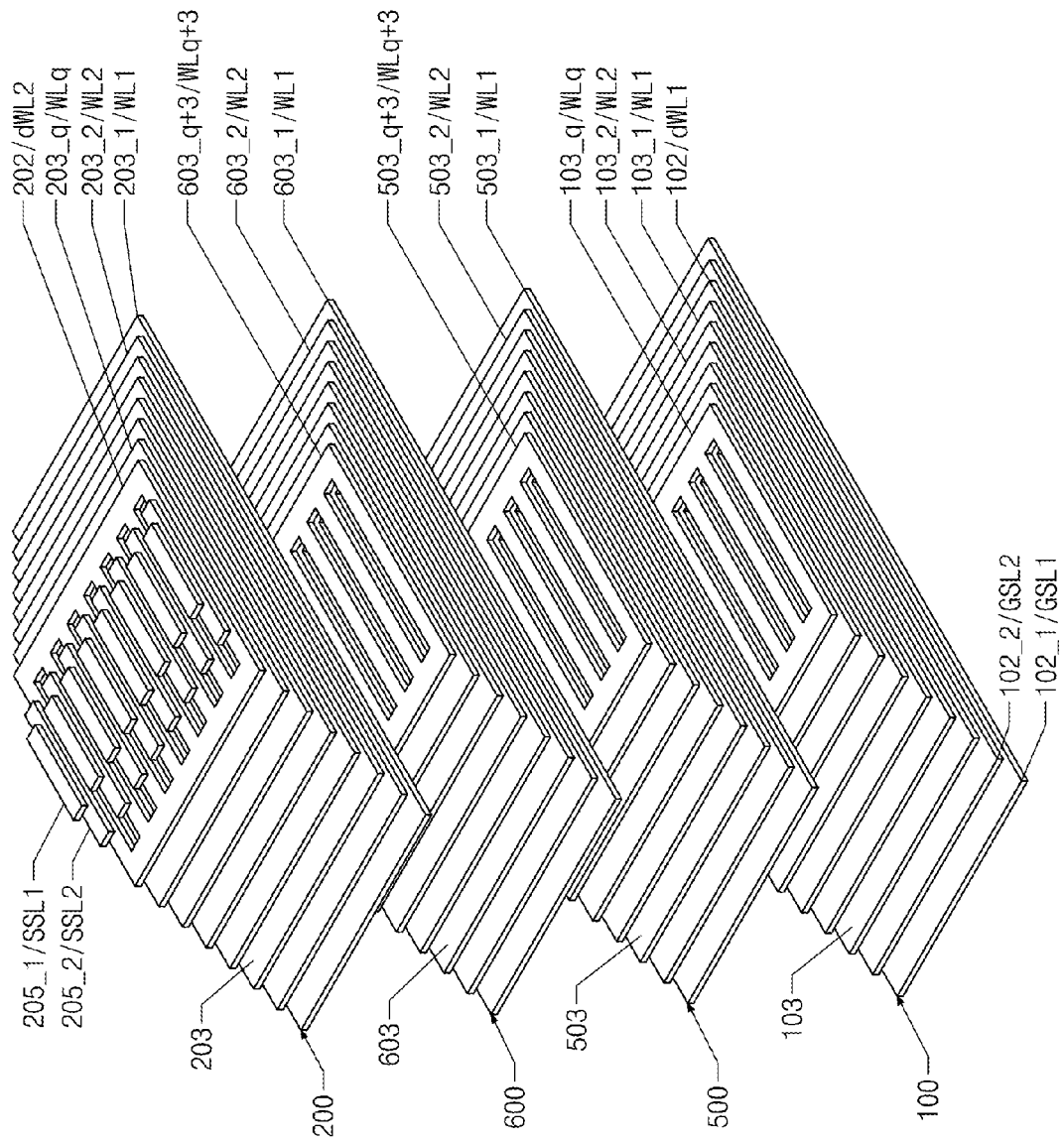

FIGS. 5C and 5D are perspective views integration density improvement according to other example embodiments of the inventive concepts. Referring to FIG. 5C, it may be assumed for purposes of explanation that the respective stacks 100, 200, 500 and 600 may be composed of 17 layers (n=16), and plural layers of word lines 103, 503, 603 and 203 may be stacked between one layer of a lower selection line 101 and one layer of an upper selection line 205. In this case, 16 layers of effective word lines may be in each of the first stack 100 and second stack 200, and 17 layers of effective word lines may be in each of the third stack 500 and fourth stack 600. In a four-stack structure, the number of effective word line layers may be 66 layers. When compared with one-stack structure illustrated in FIG. 1G, the integration density of the four-stack structure may increase to 4 times or greater, e.g., about 4.4 times.

Referring to FIG. 5D, it may be assumed for purposes of explanation that the respective stacks 100, 200, 500 and 600 may be composed of 17 layers (q=14), and a plural layers of word lines 103, 503, 603 and 203 may be stacked between two layers of lower selection line 101_1 and 101_2 and two layers of upper selection lines 205_1 and 205_2, and two layers of dummy word line 102 and 202 may be included. In this case, 14 layers of effective word lines may be provided in each of the first stack 100 and second stack 200, and 17 layers of effective word line may be provided in each of the third stack 500 and fourth stack 600. In the four-stack structure, the number of effective word line layers may be 62 layers. When compared with one-stack structure illustrated in FIG. 1I, the integration density of the four-stack structure may increase to more than 4 times, for example, about 5.64 times.

Figure 6A:
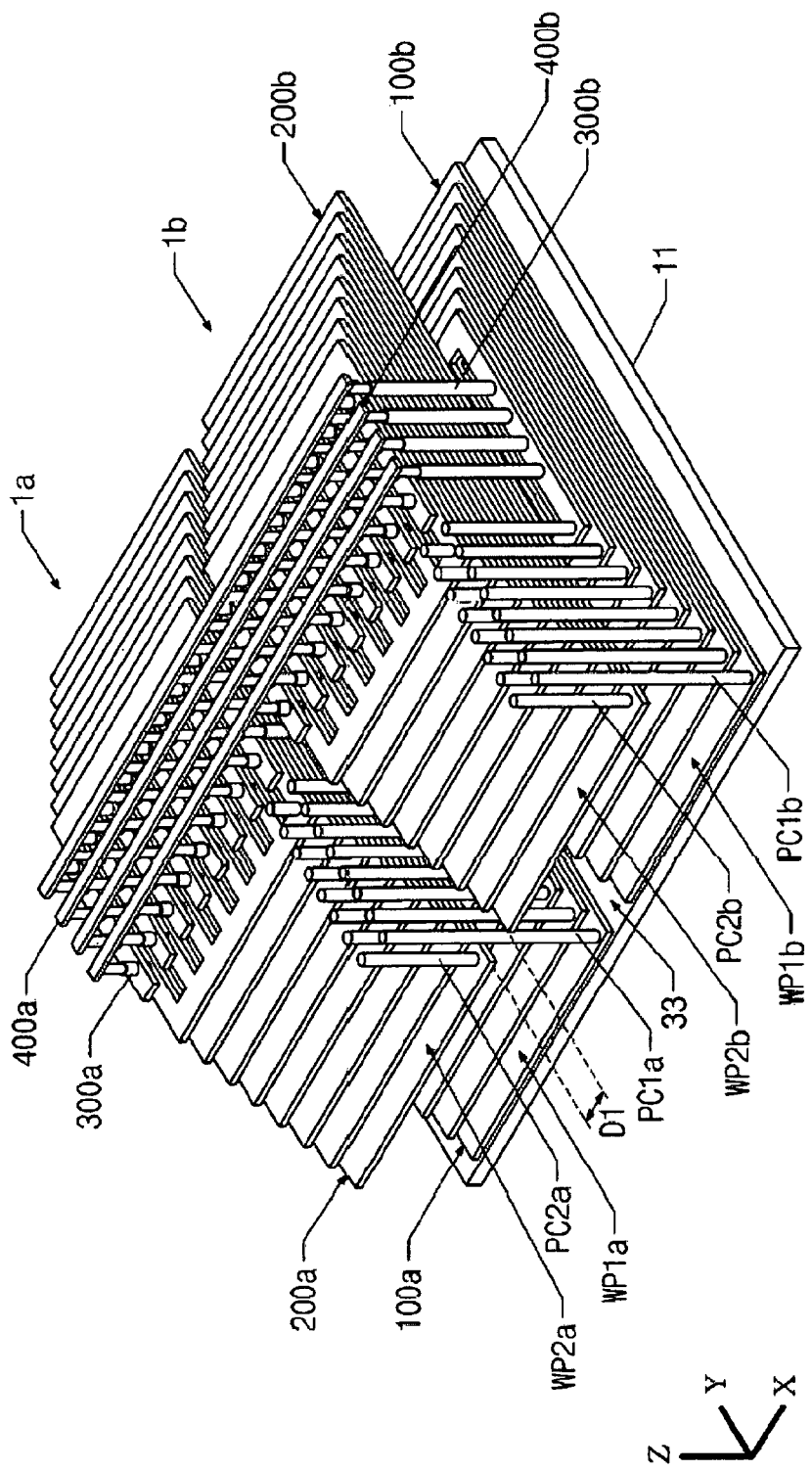
FIG. 6A is a perspective view illustrating two semiconductor memory devices of FIG. 1A arranged side by side.
Figure 6B:
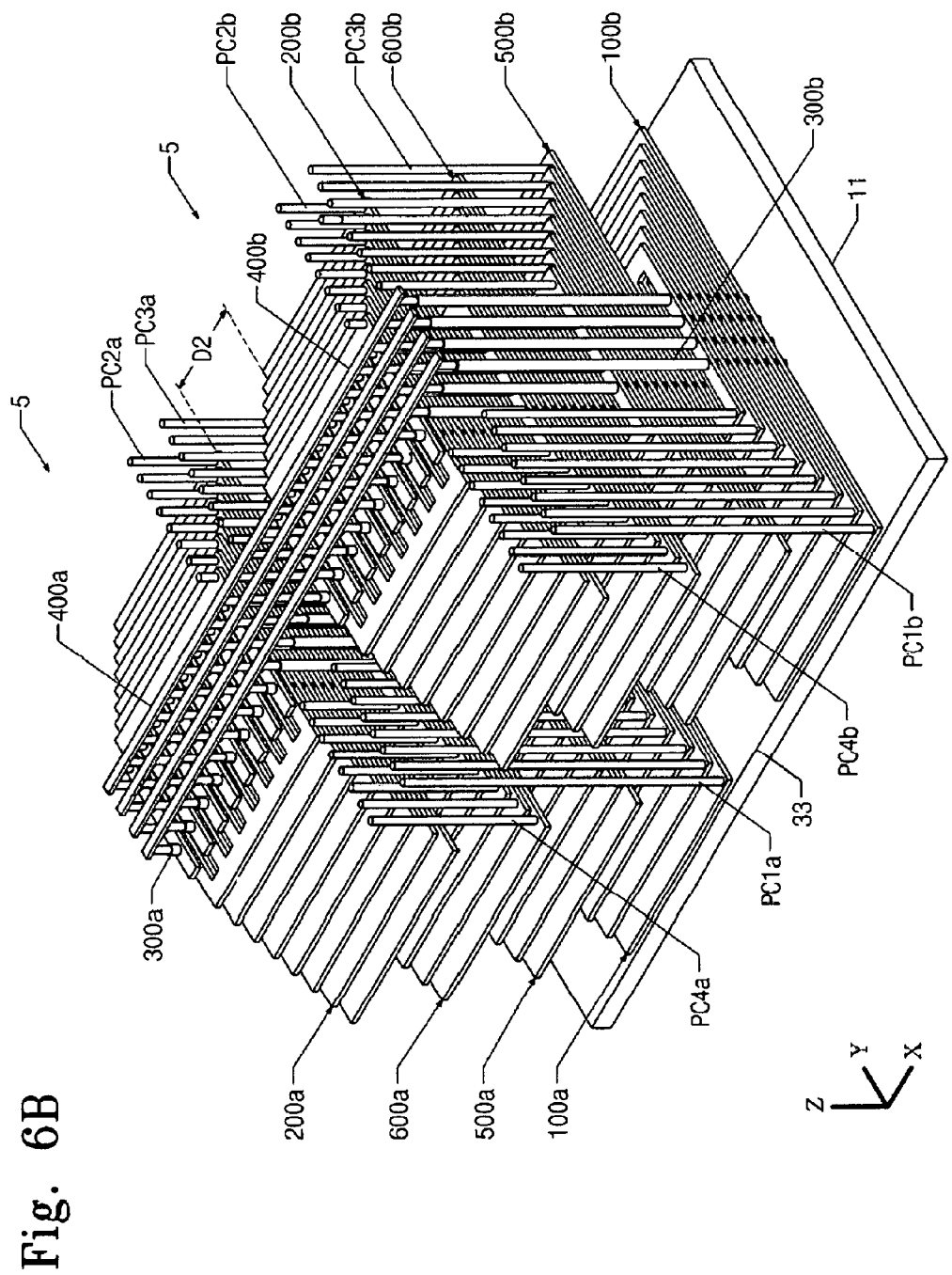
FIG. 6B is a perspective view illustrating that two semiconductor memory devices of FIG. 5A arranged side by side.

FIG. 6A is a perspective view illustrating two semiconductor memory devices 1 of FIG. 1A arranged side by side. FIG. 6B is a perspective view illustrating two semiconductor memory devices 5 of FIG. 5A arranged side by side. In FIGS. 6A and 6B, a first metal M1 and a second metal M2 may be omitted for conciseness of illustration, and the left and right distinction marks "a" and "b" may be attached to the end of reference numerals for differentiating the semiconductor memory devices 1 and 5 and their components from those illustrated in FIGS. 6A and 6B. In FIGS. 6A and 6B, the bit lines 400a extend in a first direction X, the word lines in a word line stack (e.g., left stack 100a) may have similar widths in the first direction X, may have different lengths in a second direction Y crossing the first direction X, and may be stacked on top of each other in a third direction Z substantially perpendicular to a top surface of the semiconductor substrate 11. Referring to FIG. 6A, in a case where the two semiconductor memory devices 1*a* and 1*b* with the same structure are arranged side by side, the arrangement of left word line pads WP1*a* and WP2*a*, and the arrangement of right word line pads WP1*b* Sand WP2*b* may be laterally asymmetric with respect to a global word line cut 113. The left word line pads WP1*a* and WP2*a* may be vertically asymmetric, and the right word line pads WP1*b* and WP2*b* may be vertically asymmetric.

On a semiconductor substrate 11, the left side semiconductor memory device 1*a* and the right side semiconductor memory device 1*b* may be packed as closely as possible so that integration density may be improved. For improving the integration density, a right side second stack 200*b* may be as close as possible to a left second stack 200*a*, where a space occupied by a left side first pad contact PC1*a* should be secured. According to example embodiments, the right second stack 200*b* and a left first stack 100*a* may not overlap each other vertically. As an example, the left end of the right second stack 200*b* may be aligned with the right end of the left first stack 100*a*. The size D1 of a global word line cut 33, which is a gap between the left and right second stacks 200*a* and 200*b*, may depend on the number of stacks, the size of the first contact pad PC1, a misalignment margin, and the like. The gap between the left and right first stacks 100*a* and 100*b* may also be equal to the size D1 of the global word line cut 33.

Referring to FIG. 6B, in a case where each of the left and right semiconductor memory devices 5*a* and 5*b* is a 4-stack structure, it may be desirable to align the left end of a right side second stack 200*b* with the right end of a left first stack 100*a* in order to improve integration density. The size D2 of the global line cut 33 in the 4-stack structure may be larger than the size D1 of the global line cut 33 in a 2-stack structure. Because the size of a global word line cut may depend on the number of stacks, the size of a contact pad, a misalignment margin, and the like, the size of a global word line cut may be expressed according the following equation.

Size of a global word line cut=(number of stacks−1)×(size of contact pad+misalignment margin of contact pad×2) (Eq.)

If the contact pad is of cylindrical shape, the size of the contact pad may be defined as the diameter of a top cross section. Multiplying the misalignment margin by two may be to consider misalignment margins at both left and right sides of the contact pad.

As an example, it may be assumed for purposes of explanation that a contact pad size is about 80 nm and the misalignment margin of the contact pad is about 10 nm. In the above example, a size of a global word line cut may be about 140 nm for a 2-stack structure, about 240 nm for a 3 stack structure, about 360 nm for a 4-stack structure, about 480 nm for a 5 stack structure and about 600 nm for a 6-stack structure.

Figure 7A:
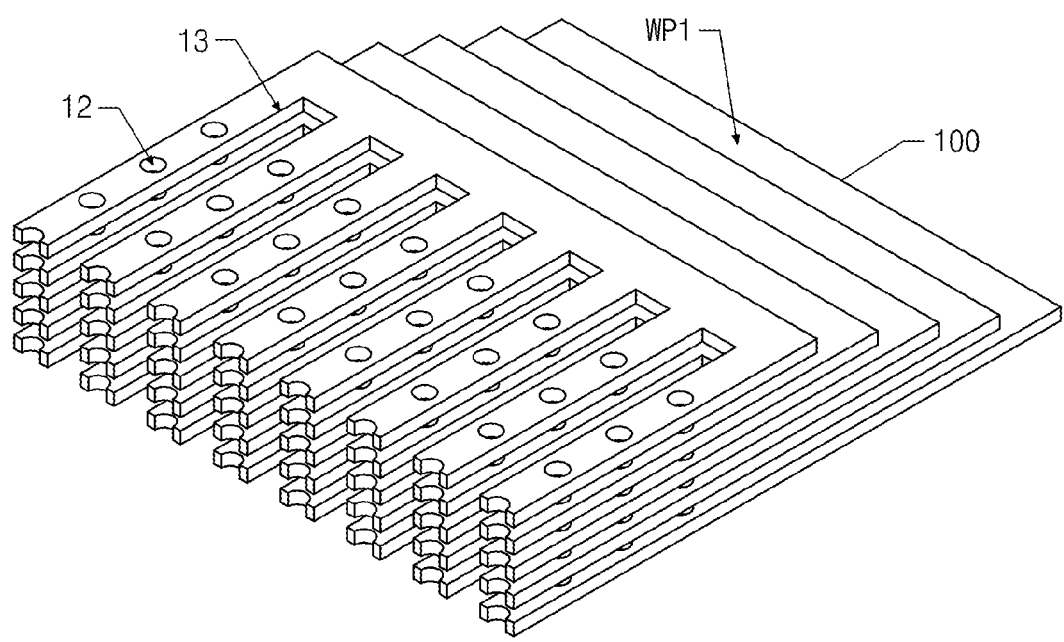
FIGS. 7A and 7B are perspective views illustrating configurations of channel holes according to example embodiments of the inventive concepts.
Figure 7B:
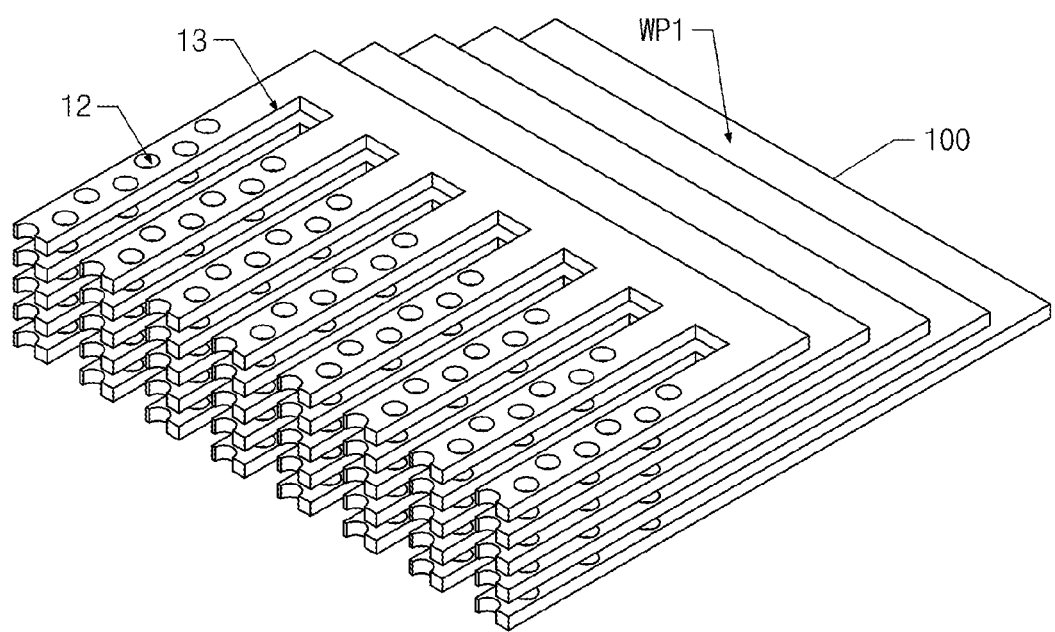

FIGS. 7A and 7B are perspective views illustrating configurations of channel holes according to example embodiments of the inventive concepts. Referring to FIG. 7A, a channel hole 12 may be arranged in a straight line form. As illustrated in FIG. 7B, the channel hole 12 may be arranged in a diagonal or zigzag form. If the channel hole 12 is arranged in a diagonal (zigzag) form, integration density may be improved.

Figure 8A:
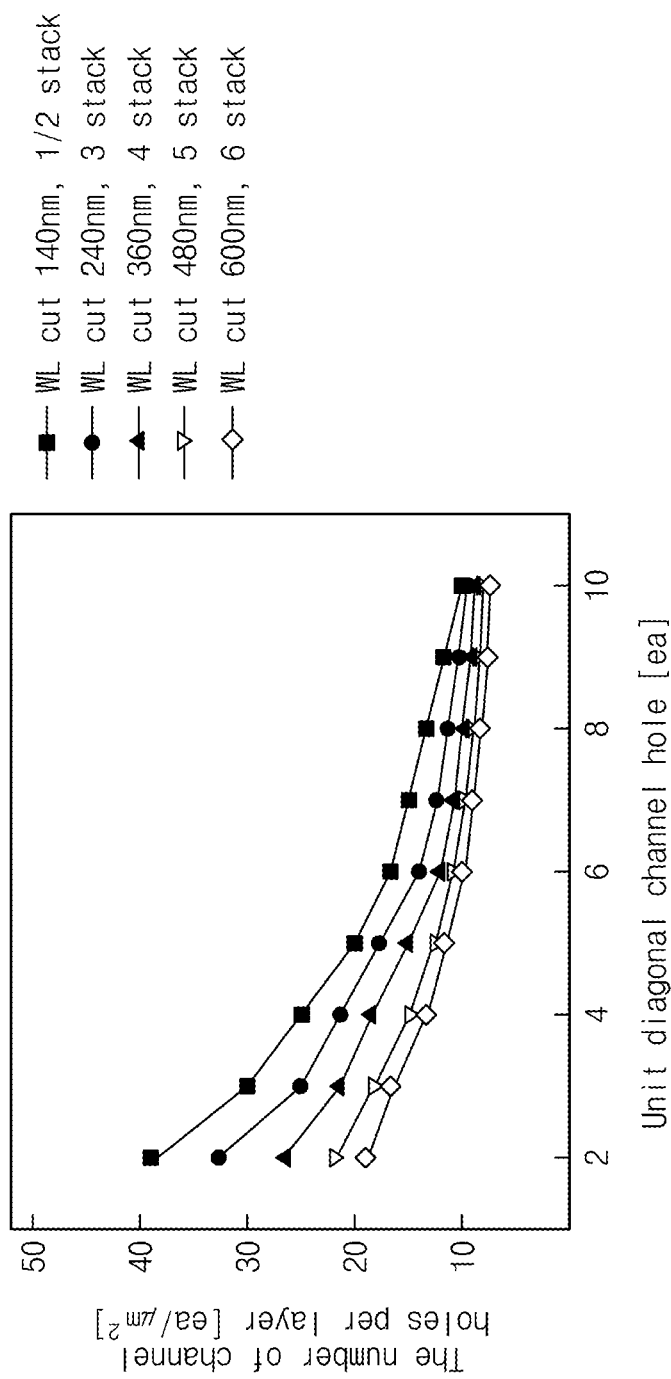
FIG. 8A is a graph of a number of channel holes per layer (ea/$\mu m^2$) as a function of a number of unit diagonal channel holes (ea)

FIG. 8A is a graph of a number of channel holes per layer (ea/μm2) as a function of a number of unit diagonal channel holes (ea) for different numbers of stacks and WL cut sizes. Referring to FIG. 8A, the number of channel holes per layer in a 2-stack structure may be equal to the number of channel holes per layer in 1-stack structure (e.g., represented as ½ stack in FIG. 8A). The size of a corresponding WL cut may be determined from FIG. 8A and/or the 'Size of a global word line cut' equation above. As illustrated in FIG. 6A, a global word line cut 33 may provide a sufficient space for a first pad contact PC1*a* to contact a first word line pad WP1. Herein, the layer may mean one layer of a word line. As the number of stacks increases to 3 or higher, the number of channel holes per layer may decrease.

This may be due to the fact that the size of the global word line cut 13 increases as the number of stacks increases, and accordingly, the number of channel holes 12 per unit area may decrease. As can be seen in FIG. 8A, it may be understood that the integration density per unit area is the highest when two of channel holes 12 are periodically arranged in a diagonal form as illustrated in FIG. 7B. FIG. 8B may be obtained if the data of FIG. 8A is multiplied by number of stacks.

Figure 8C:
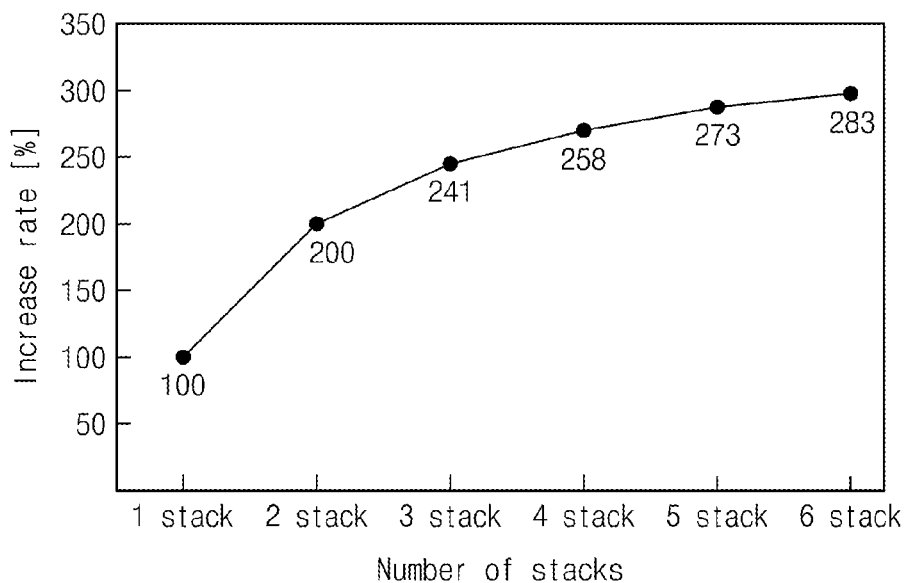
FIG. 8C is a graph of an increase rate of channel holes (%) as a function of a number of stacks according to example embodiments of the inventive concepts.

FIG. 8B is a graph of a number of channel holes according to a number of stacks. FIG. 8C is a graph of an increase rate of channel holes according to a number of stacks. Referring to FIG. 8B, in a 2-stack structure, the number of channel holes may be almost two times the number of channel holes in a one-stack structure. For a fixed number of unit diagonal channel holes, the number of channel holes increases as the number of stacks increases. When the number of stacks is 3 or more, the increasing rate of channel holes may decrease gradually. FIG. 8C may illustrate the decrease in increasing rate of FIG. 8B. FIG. 8C may be based on two channel holes. For example, when the number of unit diagonal channel holes is 2 in FIG. 8B, the increasing rate of the number of channel holes in a 2 stack structure (n=2) may be twice that of a 1 stack structure (n=1). As n increases cell efficiency decreases as a WL cut size increases. The increase rate may be smoothly decreasing as the number of stacks increases. As one example, a 2 stack structure may include 28 more word lines than a 1 stack structure. A 4 stack structure (QWL) may include 68 (17×4) word lines. A 6 stack structure (SeWL) may include 96 word lines.

Figure 8D:
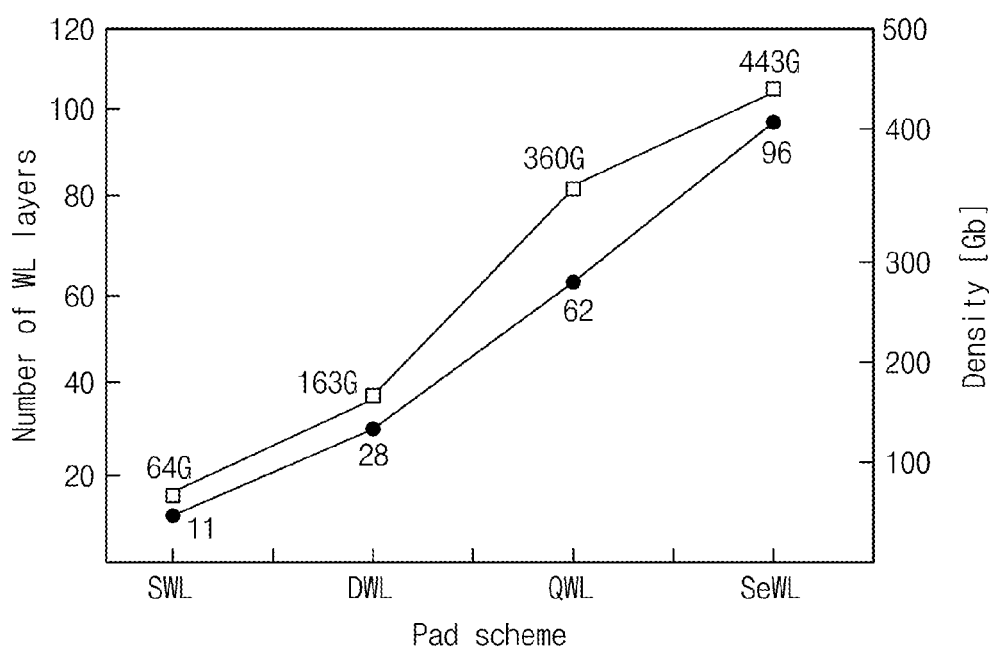
FIG. 8D is a graph of a number of word line layers and density (Gb) as a function of pad schemes according to example embodiments of the inventive concepts.

FIG. 8D is a graph of a number of word line layers and density depending on a number of stacks. Referring to FIG. 8D, density may increase depending on an increase in the number of word lines in a 2-stack structure (DWL) as compared to one-stack structure (SWL). In the case of a 4-stack structure (QWL), density increases rapidly, but, in the case of a 6-stack structure (SeWL), even though the number of word lines increases, the density increase may be small because the size of a global word line cut increases.

Figure 9A:
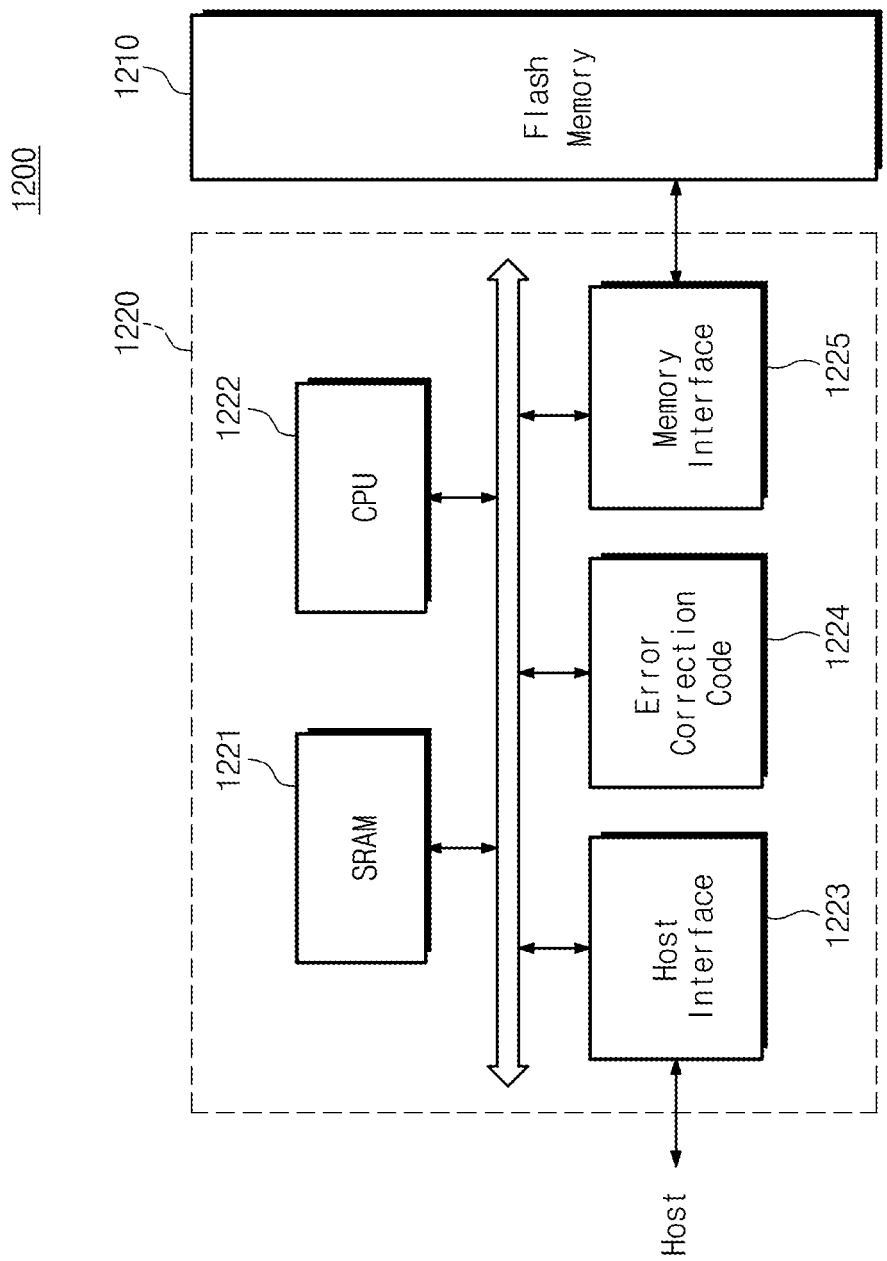

FIG. 9A is a block diagram illustrating memory cards with semiconductor memory devices according to example embodiments of the inventive concepts. Referring to FIG. 9A, a memory card 1200, which may be used for supporting a high volume of data storage capacity, may include a flash memory 1210. The flash memory 1210 may include a semiconductor memory device according to example embodiments of the inventive concepts described above with respect to FIGS. 1A-8D, for example, a NAND flash memory device.

The memory card 1200 may include a memory controller 1220 which controls various data exchanges between a host and the flash memory 1210. A static random access memory (SRAM) 1221 may be used as a working memory of a central processing unit (CPU) 1222. A host interface 1223 may include a data exchange protocol of the host connected to the memory card 1200. An error correction code (ECC) 1224 may detect and correct an error which is contained in data read out from the flash memory 1210. A memory interface 1225 may interface with the flash memory 1210. The CPU 1222 may perform various control actions for data exchange. Although not shown, the memory card 1200 may include a read only memory (ROM) which stores code data for interfacing with the host.

Figure 9B:
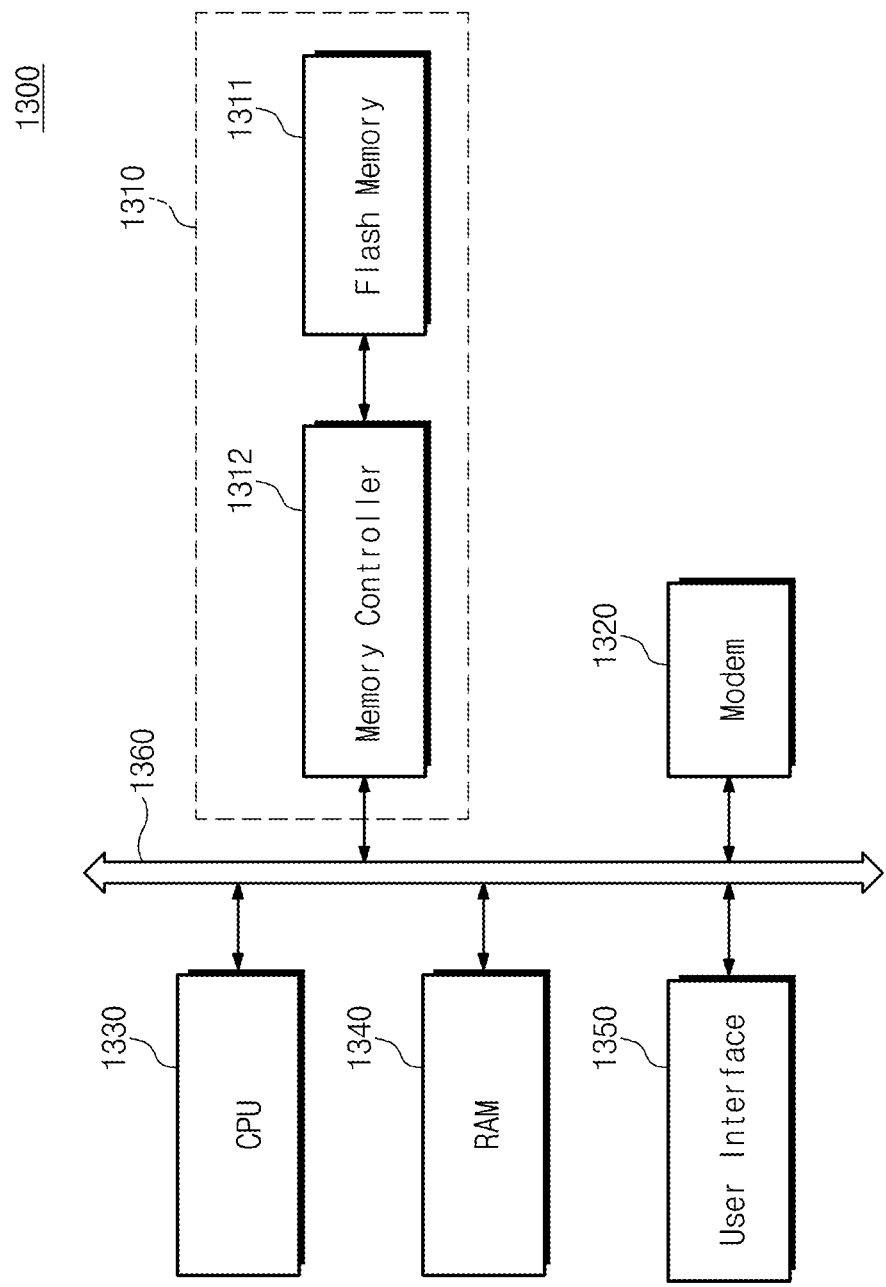

FIG. 9B is a block diagram illustrating data processing systems according to example embodiments of the inventive concepts. Referring to FIG. 9B, a data processing system 1300 according to example embodiments of the inventive concepts may include a semiconductor memory device described above with respect to FIGS. 1A-8D, for example, a flash memory system 1310 including a flash memory 1311 and a memory controller 1312. The data processing system 1300 may include a mobile device and/or computer and/or the like. As an example, the data processing system 1300 may include a flash memory system 1310, a modem 1320, a CPU 1330, a RAM 1340 and/or a user interface 1350 electrically connected to a system bus 1360, respectively. In the flash memory system 1310, the data processed by the CPU 1330 and/or the data input from the outside may be stored.

The data processing system 1300 may be, for example, a memory card, a solid state disk, a camera image sensor and/or other application chipset. As an example, a flash memory system 1310 may be composed of a solid state disk (SSD), and in this case, the data processing system 1300 may store a high volume of data stably and reliably in the flash memory system 1310.

According to example embodiments of the inventive concepts, two or more word line stacks may be stacked such that an upper stack may be shifted with respect to a lower stack. A portion of a word line pad of the lower stack, which is in contact with a pad contact, may be exposed. Integration density can be improved without or almost without an increase in chip area.

While example embodiments have been particularly shown and described, it will be understood by one of ordinary skill in the art that variations in form and detail may be made therein without departing from the spirit and scope of the claims.

What is claimed is:

1. A semiconductor memory device, comprising:
a first stack including a plurality of first word lines having substantially identical widths in a first direction and different lengths in a second direction crossing the first direction, the plurality of first word lines including a plurality of first contact regions at edges of the plurality of first word lines;
a second stack on the first stack, the second stack including a plurality of second word lines having substantially identical widths in the first direction and different lengths in the second direction, the second word lines including a plurality of second contact regions at edges of the plurality of second word lines;
a third stack on the second stack, the third stack including a plurality of third word lines having substantially identical widths in the first direction and different lengths in the second direction, the plurality of third word lines including a plurality of third contact regions at edges of the plurality of third word lines;
a fourth stack on the third stack the fourth stack including a plurality of fourth word lines having substantially identical widths in the first direction and different lengths in the second direction, the plurality of fourth word lines including a plurality of fourth contact regions at edges of the plurality of fourth word lines;
at least one bit line on the fourth stack that extends along the first direction; and
a first contact group including a plurality of first pad contacts in contact with the plurality of first contact regions, the plurality of first pad contacts aligned along the second direction;
a second contact group including a plurality of second pad contacts in contact with the plurality of second contact regions, the plurality of second pad contacts aligned along the second direction,
a third contact group including a plurality of third pad contacts in contact with the plurality of third contact regions, the plurality of third pad contacts aligned along the second direction,
a fourth contact group including a plurality of fourth pad contacts in contact with the plurality of fourth contact regions, the plurality of fourth pad contacts aligned along the second direction,
one of the first contact group, the second contact group, the third contact group, and the fourth contact group being shifted along the first direction compared to another of the first contact group, the second contact group, the third contact group, and the fourth contact group, wherein
the first contact regions include a plurality of first word lines pads stacked stepwise along a third direction crossing the first and second directions,
the plurality of first word line pads include a second side opposite a first side,
the second contact regions include a plurality of second word lines pads stacked stepwise along the third direction,
the plurality of second word line pads include a third side overlapping the first side and a fourth side overlapping the second side,
the third contact regions include a plurality of third word lines pads stacked stepwise along the third direction,
the plurality of third word line pads include a fifth side overlapping the third side and a sixth side overlapping the fourth side,
the fourth contact regions include a plurality of fourth word lines pads stacked stepwise along the third direction, and
the plurality of fourth word line pads include a seventh side overlapping the fifth side and an eighth side overlapping the sixth side.

2. The semiconductor memory device of claim 1, wherein the plurality of first pad contacts are in contact with the plurality of first word line pads on the first side,
the plurality of second pad contacts are in contact with the plurality of second word line pads on the fourth side,
the plurality of third pad contacts are in contact with the plurality of third word line pads on the fifth side, and
the plurality of fourth pad contacts are in contact with the plurality of fourth word line pads on the eighth side.

3. The semiconductor memory device of claim 2, wherein the first and third contact groups are at one side of the at least one bit line, and
the second and fourth contact groups are at the other side of the at least one bit line.

4. The semiconductor memory device of claim 3, wherein the first contact group overlaps the third contact group along the first direction, and the second contact group overlaps the fourth contact group along the first direction.

* * * * *